(12) United States Patent
Ricker et al.

(10) Patent No.: US 10,304,223 B1
(45) Date of Patent: May 28, 2019

(54) METHOD AND SYSTEM FOR SUFFICIENCY EVALUATION OF CHANGES TO A WELL MONITORING SYSTEM

(71) Applicant: Petra Analytics, LLC, Marietta, GA (US)

(72) Inventors: Joseph Allen Ricker, Olive Branch, MS (US); Timothy O. Goist, Marietta, GA (US); David C. Winchell, Collierville, TN (US)

(73) Assignee: Petra Analytics, LLC, Marietta, GA (US)

( * ) Notice: Subject to any disclaimer, the term of this patent is extended or adjusted under 35 U.S.C. 154(b) by 242 days.

(21) Appl. No.: 15/236,677

(22) Filed: Aug. 15, 2016

Related U.S. Application Data

(63) Continuation of application No. 15/178,729, filed on Jun. 10, 2016, now abandoned.

(51) Int. Cl.
   *G06T 11/20* (2006.01)
   *G06F 3/0482* (2013.01)
   *G06F 3/0484* (2013.01)

(52) U.S. Cl.
   CPC .......... *G06T 11/206* (2013.01); *G06F 3/0482* (2013.01); *G06F 3/04845* (2013.01); *G06T 2200/24* (2013.01)

(58) Field of Classification Search
   CPC . G06T 11/206; G06T 2200/24; G06F 3/0482; G06F 3/04845
   See application file for complete search history.

(56) References Cited

U.S. PATENT DOCUMENTS

| | | | |
|---|---|---|---|
| 2013/0006538 A1* | 1/2013 | Ricker | G06Q 10/04 702/24 |
| 2015/0058091 A1* | 2/2015 | Goist | G06Q 10/0637 705/7.36 |

OTHER PUBLICATIONS

Author: Joseph A. Ricker. Title: A Practical Method to Evaluate Ground Water Contaminant Plume Stability, 2008 Source: https://pdfs.semanticscholar.org/e214/0e875c6d84005cc8574efd228f8e12837d68.pdf.*
Author: Joe A. Ricker, P.E., Title: Groundwater Contaminant Plume Stability Analysis, Oct. 3, 2015 Source: https://web.archive.org/web/20151003032348/https://dnr.mo.gov/env/hwp/docs/plume_stability_ricker.pdf.*
Author: Joe A. Ricker, P.E., Title: Groundwater Plume Analysis for Assessing Remediation Effectiveness, Apr. 25, 2016 Source: http://www.esaa.org/wp-content/uploads/2016/10/16-Ricker.pdf.*

* cited by examiner

*Primary Examiner* — Jwalant Amin
(74) *Attorney, Agent, or Firm* — Meunier Carlin & Curfman LLC

(57) ABSTRACT

Disclosed are exemplified methods and systems that uses scientific and statistical basis to determine whether wells can be removed from a monitoring network and/or whether the frequency of well sampling can be reduced and/or whether the number of constituents being analyzed can be reduced. The exemplified method facilitates a more accurate and precise assessment of the sufficiency of the monitoring in decision making processes to modify the monitoring protocol of wells at a given contaminated site as well as to provide a defensible assessment and analysis that is empirical, graphical, and easy to understand.

21 Claims, 21 Drawing Sheets

STATISTICAL SUMMARY

| | AREA | CONCEN-TRATION | MASS |
|---|---|---|---|
| AVERAGE RPD | 0.26% | 7.02% | 6.84% |
| CORRELATION | 0.99 | 1.00 | 1.00 |

504 / 502

504a / 502a, 504b / 502b, 504c / 502c

DIFFERENCE BETWEEN WELLS SETS

| DATE | AREA | CONCEN-TRATION | MASS |
|---|---|---|---|
| JAN-2000 | 0.48% | 5.96% | 5.48% |
| JAN-2001 | 0.46% | 5.67% | 5.21% |
| JAN-2002 | 0.44% | 6.27% | 5.84% |
| JAN-2003 | 0.38% | 6.17% | 5.79% |
| JAN-2004 | 0.35% | 6.48% | 6.14% |
| JAN-2005 | 0.31% | 6.62% | 6.31% |
| JAN-2006 | 0.15% | 7.14% | 6.99% |
| JAN-2007 | 0.29% | 6.17% | 6.49% |
| JAN-2008 | 0.08% | 7.04% | 6.96% |
| JAN-2009 | 0.04% | 7.19% | 7.14% |
| JAN-2010 | 0.57% | 7.29% | 6.72% |
| JAN-2011 | 0.08% | 7.79% | 7.87% |
| JAN-2012 | 0.02% | 7.60% | 7.58% |
| JAN-2013 | 0.02% | 7.74% | 7.77% |
| JAN-2014 | 0.51% | 7.97% | 7.46% |
| JAN-2015 | 0.12% | 8.03% | 8.15% |
| JAN-2016 | 0.17% | 8.17% | 8.34% |

500

506

WELLS REMOVED

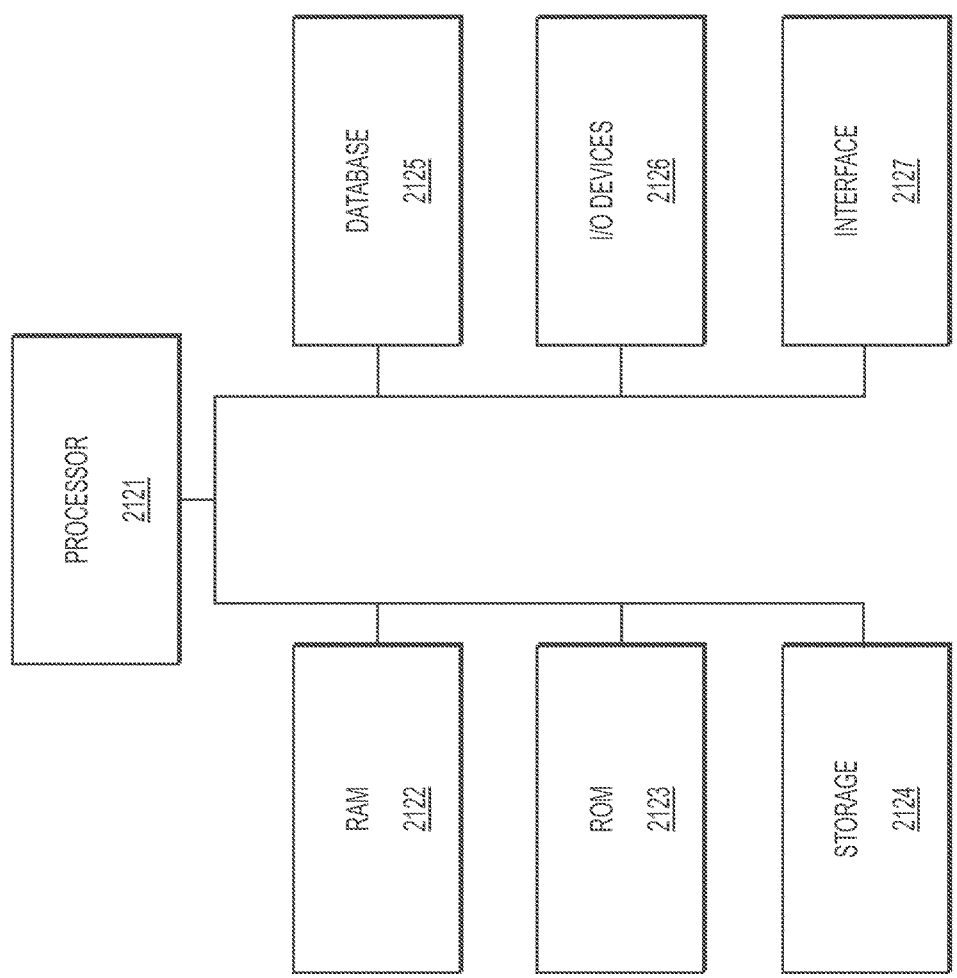

METHOD AND SYSTEM FOR SUFFICIENCY EVALUATION OF CHANGES TO A WELL MONITORING SYSTEM

CROSS-REFERENCE TO RELATED APPLICATIONS

This application is a continuation application of U.S. patent application Ser. No. 15/178,729, filed Jun. 10, 2016, which is incorporated by reference herein in its entirety.

BACKGROUND

Groundwater monitoring wells have been installed at tens of thousands of sites across the United States and the world to monitor groundwater contaminant plumes. Once installed, these monitoring wells are typically subjected to years or decades of monitoring at pre-defined sampling intervals (e.g., quarterly, semi-annually, annually, or other determined frequency or schedule). Over time, as a groundwater plume is cleaned-up, or if the extent of the contamination is assessed to be reducing, it may no longer be necessary to continue monitoring at past sampling intervals or sampling extent.

Tremendous cost savings can be recognized, for example, by reducing the number of wells sampled and/or by reducing the frequency of sampling and/or the number of constituents being analyzed. This is especially the case where it is determined that the groundwater plume is stable (i.e., not moving) or decreasing in size and/or concentration and/or mass.

Certain practices, by environmental professionals, to modify the monitoring well network and/or sampling frequency (these combined are referred to herein as a "monitoring well system") often rely on the subjective professional judgement of the environmental professionals, which often varies among professionals based on their respective experience and education. Because different practitioners can have different experiences with the assessment of a monitoring well system, they can come up with different opinions for the same set of data and measurements.

In addition, opinions on a monitoring well system provided by environmental professionals are often subjected to challenges by environmental regulators. Because of a lack of an established benchmark to determine when a well can be removed from a monitoring network or when a well can be sampled less often, the final decision on modifying a monitoring well system may be non-empirically based. For example, it may be determined based on the personalities or on environmental professional who makes the strongest assertions.

One class of programs (such as MAROS "Monitoring and Remediation Optimization System") are used to assist the environmental professional and the regulator in making this decision. However, these programs are often limited in the presentation of information in a manner that can be readily used by environmental professional or to support a given assessment position.

What are needed are devices, systems and methods that overcome challenges in the present art, some of which are described above.

SUMMARY

Disclosed herein are exemplified methods and systems that uses scientific and statistical basis to determine whether wells can be removed from a monitoring network and/or whether the frequency of well sampling can be reduced and/or whether the number of constituents being analyzed can be reduced. The exemplified method is also referred to herein as the Ricker Method Well Sufficiency Analysis method. In addition to facilitating a more accurate and precise assessment of the sufficiency of the monitoring system in decision making processes to modify the monitoring protocol of wells at a given contaminated site, the exemplified methods and systems provide a defensible assessment and analysis that is empirical, graphical, and easy to understand.

In an aspect, a method is disclosed to determine sufficiency of analysis of monitoring well data for a given site (e.g., to determine whether wells can be removed from a monitoring network and/or whether a frequency of well sampling can be reduced and/or whether the number of constituents being analyzed can be reduced without affecting observability of the monitoring). The method includes determining, via a processor, a first plume area profile (e.g., an areal trend line), a first plume average concentration profile (e.g., an average concentration trend line), and a first plume mass profile (e.g., a mass trend line) associated with a first set of grid data generated from a first set of wells test data associated with a network of monitoring wells used to monitor plume contamination at a site; and determining, via the processor, a second plume area profile (e.g., a second areal trend line), a second plume average concentration profile (e.g., a second average concentration trend line), and a second plume mass profile (e.g., a second mass trend line) from a second set of grid data generated from a second set of wells test data associated with the network of monitoring wells, wherein the second set of wells test data includes a sampling configuration selected from the group consisting of: i) one or more less monitoring wells from the network of monitoring wells, ii) a lower sampling frequency of the monitoring, and iii) a fewer number or different tested analytes sampled from the network of monitoring wells.

The method further includes generating (e.g., via the processor) a plurality of sufficiency parameters for assessing sufficiency of the second set of wells test data, wherein the plurality of sufficiency parameters includes one or more sufficiency parameters for each of i) a first comparison of the first plume area profile with the second plume area profile, ii) a second comparison of the first average concentration profile and the second average concentration profile, and iii) a third comparison of the first mass profile and the second mass profile, wherein each of the one or more sufficiency parameters (e.g., for the first, second, and third comparisons) are selected from the group consisting one or more Mann-Kendall parameters, one or more linear regression parameters, one or more correlation parameters, and one or more relative-percent difference parameters; and presenting or storing the generated one or more sufficiency parameters.

In some embodiments, the one or more sufficiency parameters only consist of the one or more Mann-Kendall parameters, the one or more linear regression parameters, the one or more correlation parameters, and the one or more relative-percent difference parameters.

In another aspect, a system is disclosed of operating a well-sufficiency analysis tool (e.g., for assessment of modification of monitoring of a plume without materially affecting, and/or substantially reducing, plume stability evaluation). The system includes a processor; and a memory having instructions stored thereon, wherein execution of the instructions, cause the processor to: present, via a graphical user interface, at a first panel, a plurality of graphical objects each associated with a monitoring well, wherein data associated with each of the monitoring wells are used, in a plume analysis, to determine a first areal trend line (e.g., an areal baseline), a first average concentration trend line (e.g., an average concentration baseline), and a first mass indicator trend line (e.g., a mass indicator baseline), associated with a given plume site and for a first group of monitoring wells, wherein the first group of monitoring wells comprises a first number of monitoring wells; and upon receipt, via the graphical user interface, at the first panel, selection of one or more graphical objects to remove, from a subsequent plume analysis, the one or more associated monitoring wells associated with the one or more selected graphical objects (e.g., by addition of the one or more associated wells to a remove list or removal of the one or more associated wells from a run list): i) determine, in the subsequent plume analysis, a second areal trend line, a second average concentration trend line, and a second mass indicator trend line, associated with the given plume site and for a second group of monitoring wells, wherein the second group of monitoring wells comprises a second number of monitoring wells, and wherein the second number of monitoring wells is less than the first number of monitoring wells (e.g., less by the one or more associated monitoring wells associated with the selected graphical objects); and ii) present, via the graphical user interface, a first visual representation of the first and second areal trend lines, a second visual representation of the first and second average concentration trend lines, a third visual representation of the first and second mass indicator trend lines, and one or more visual representations for one or more statistical parameters associated with (e.g., derived from) each of the first, second, and third visual representations, wherein at least one of the one or more presented statistical parameters is selected from the group consisting of a linear regression parameter, a Mann-Kendall parameter (e.g., an index of whether a trend exists and whether the trend is positive or negative), a correlation parameter, and a relative percent difference parameter.

In some embodiments, the instructions, when executed, further cause the processor to: upon receipt, via the graphical user interface, at the first panel, second selection of one or more graphical objects to add one or more associated monitoring wells to a second subsequent plume analysis (e.g., by addition of the one or more associated wells to the run list or removal of the one or more associated wells from the remove list): i) determine, in the second subsequent plume analysis, a third areal trend line, a third average concentration trend line, and a third mass indicator trend line, associated with the given plume site and for a third group of monitoring wells, wherein the third group of monitoring wells comprises a third number of monitoring wells, and wherein the third number of monitoring wells is greater than the second number of monitoring wells (e.g., greater by the one or more associated monitoring wells associated with the selected graphical objects of the second selection); and ii) present, via the graphical user interface, a modified first visual representation of the first and third areal trend line, a modified second visual representation of the first and third average concentration trend line, and a modified third visual representation of the first and second mass indicator trend line, and one or more modified visual representations for one or more second statistical parameters associated with (e.g., derived from) each of the modified first, second, and third visual representations, wherein at least one of the one or more second statistical parameters is selected from the group consisting of the linear regression parameter, the Mann-Kendall parameter, the correlation parameter, and the relative percent difference parameter.

In some embodiments, the one or more visual representations (e.g., and the one or more modified visual representations) for the one or more statistical parameters comprise: a fourth visual representation of the linear regression parameter; a fifth visual representation of the Mann-Kendall parameter; a sixth visual representation of the correlation parameter; and a seventh visual representation of the relative percent difference parameter.

In some embodiments, the instructions, when executed by the processor, cause the processor to: prompt, via the graphical user interface, an analysis start time parameter and an analysis end time parameter, wherein the plume analysis and the subsequent plume analysis are performed using data associated with a time period between a first value associated with the analysis start time parameter and a second value associated with the analysis end time parameter.

In some embodiments, each of the first, second, third, fourth, fifth, and sixth visual representations is presented in a second panel of the graphical user interface.

In some embodiments, the first, second, and third visual representations are presented, respectively, in a second, third, and fourth panels, of the graphical user interface.

In some embodiments, the instructions, when executed by the processor, cause the processor to evaluate an areal extent, an average concentration, a mass indicator, and a location of a plume center of mass, for the given plume, using data associated with a set of monitoring wells.

In some embodiments, the plurality of graphical objects associated with monitoring wells are presented as selectable widgets on a visual representation of a map.

In some embodiments, the instructions, when executed by the processor, cause the processor to generate i) a report with data associated with the first and second areal trend lines, the first and second average concentration trend lines, the first and second mass indicator trend lines, the linear regression parameter, the Mann-Kendall parameter, the correlation parameter, and the relative percent difference parameter or ii) a report with data associated with the visualization thereof.

In another aspect, a system is disclosed (e.g., of reducing numbers, or sampling frequencies or sampling analytes, of monitoring wells associated with a given plume without materially affecting plume stability evaluation). The system includes a processor; and a memory having instructions stored thereon, wherein the instructions, when executed by the processor, cause the processor to: receive plume stability evaluation data for a given plume, the plume stability evaluation data being associated with a plurality of monitoring wells, wherein each evaluation data includes plume areal parameters over time, plume average concentration parameters over time, and plume mass parameters over time; determine a first set of trend lines using a first set of the plume stability evaluation data associated with a first set of monitoring wells, wherein the first set of monitoring wells comprises a first number of monitoring wells, wherein the first set of trend lines includes a first areal trend line, a first average concentration trend line, and a first mass indicator trend line; determine a second set of trend lines using a second set of the plume stability evaluation data associated with a second set of monitoring wells, wherein the second set of monitoring wells comprises a second number of monitoring wells, wherein the second set of trend lines including a second areal trend line, a second average concentration trend line, and a second mass indicator trend line, wherein the second number of monitoring wells is different from (e.g., lower than) the first number of monitoring wells, and wherein the first set of monitoring wells includes one or more wells not included in the second set of monitoring wells; and cause i) via a display, presentation of a plurality of graphical outputs of the first set of trend lines, the second set of trend lines, and one or more statistical parameters associated therewith and/or ii) generation of a report (e.g., a file) with the plurality of graphical outputs or data associated with the plurality of graphical outputs.

In some embodiments, the plurality of presentations include i) a first graphical presentation with the first areal trend line and the second areal trend line, ii) a second graphical presentation with first average concentration trend line and the second average concentration trend line, and iii) a third graphical presentation with the first mass indicator trend line and the second mass indicator trend line. In some embodiments, the plurality of presentations further comprise: iv) a fourth graphical presentation of a Mann-Kendall parameter associated with each of the first, second, and third graphical presentations, v) a fifth graphical presentation of a correlation parameter associated with each of the first, second, and third graphical presentations, vi) a sixth graphical presentation of a relative-percent difference parameter associated with each of the first, second, and third graphical presentations, and vii) a seventh graphical presentation of a linear regression parameter associated with each of the first, second, and third graphical presentations.

In some embodiments, the one or more monitoring wells comprise a strong sufficiency classification for removal or reduced sampling (e.g., frequency or analyte) when i) each of the Mann-Kendall parameters among the first, second, and third presentations are the same, ii) each of the linear regression parameter among the first, second third presentations are the same, iii) at least one of the relative percent difference among the first, second third presentations are less than 20 percent, and iv) each of the correlation coefficient among the first, second third presentations is greater than 0.8.

In some embodiments, the one or more monitoring wells comprise a very strong sufficiency classification for removal or reduced sampling (e.g., frequency of analyte) when i) each of the Mann-Kendall parameters among the first, second, and third presentations are the same, ii) each of the linear regression parameter among the first, second third presentations are the same, iii) at least one of the relative percent difference among the first, second third presentations are less than 10 percent, and iv) each of the correlation coefficient among the first, second third presentations is greater than 0.9.

In some embodiments, the one or more monitoring wells comprises a poor sufficiency classification for removal or reduced sampling (e.g., frequency of analyte) when i) at least one of the relative percent difference among the first, second, third presentations are greater than 30 percent, and ii) each of the correlation coefficient among the first, second, third presentations is less than 0.7.

In another aspect, a computer readable medium is disclosed. The computer readable medium having instructions stored thereon, wherein the instructions when executed by a processor, cause the processor to: present, via a graphical user interface, at a first panel, a plurality of graphical objects each associated with a monitoring well, wherein each of the monitoring wells are used, in a plume analysis, to determine a first areal trend line, a first average concentration trend line, and a first mass indicator trend line, associated with a given plume site for a first group of monitoring wells associated with a plume, wherein the first group of monitoring wells comprises a first number of monitoring wells; upon receipt, via the graphical user interface, at the first panel, selection of one or more graphical objects to remove the one or more associated monitoring wells from a subsequent plume analysis (e.g., by addition of the one or more associated wells to a remove list or removal of the one or more associated wells from a run list): determine, in the subsequent plume analysis, a second areal trend line, a second average concentration trend line, and a second mass indicator trend line, associated with the given plume site for a second group of monitoring wells, wherein the second group of monitoring wells comprises a second number of monitoring wells, and wherein the second number of monitoring wells is less than the first number of monitoring wells (e.g., less by the one or more associated monitoring wells associated with the selected graphical objects); and present, via the graphical user interface, a first visual representation of the first and second areal trend line, a second visual representation of the first and second average concentration trend line, a third visual representation of the first and second mass indicator trend line, and one or more visual representations for one or more statistical parameters associated with (e.g., and derived from) each of the first, second, and third visual representations, wherein at least one of the one or more statistical parameters is selected from the group consisting of a linear regression parameter, a Mann-Kendall parameter (e.g., an index of whether a trend exists and whether the trend is positive or negative), a correlation parameter, and a relative percent difference parameter.

In some embodiments, the instructions, when executed, further cause the processor to: upon receipt, via the graphical user interface, at the first panel, second selection of one or more graphical objects to add one or more associated monitoring wells to a second subsequent plume analysis (e.g., by addition of the one or more associated wells to the run list or removal of the one or more associated wells from the remove list): i) determine, in the second subsequent plume analysis, a third areal trend line, a third average concentration trend line, and a third mass indicator trend line, associated with the given plume site for a third group of monitoring wells, wherein the third group of monitoring wells comprises a third number of monitoring wells, and wherein the third number of monitoring wells is greater than the second number of monitoring wells (e.g., greater by the one or more associated monitoring wells associated with the selected graphical objects of the second selection); and ii) present, via the graphical user interface, a modified first visual representation of the first and third areal trend line, a modified second visual representation of the first and third average concentration trend line, and a modified third visual representation of the first and second mass indicator trend line, and one or more modified visual representations for one or more second statistical parameters associated with (e.g., and derived from) each of the modified first, second, and third visual representations, wherein at least one of the one or more second statistical parameters is selected from the group consisting of the linear regression parameter, the Mann-Kendall parameter, the correlation parameter, and the relative percent difference parameter.

In some embodiments, the one or more visual representations (e.g., and the one or more modified visual representations) associated with the one or more statistical parameters comprise: a fourth visual representation of the Mann-Kendall parameter; a fifth visual representation of the correlation parameter; a sixth visual representation of the relative percent difference parameter; and a seventh visual representation of the linear regression parameter.

In some embodiments, each of the first, second, third, fourth, fifth, and sixth visual representations is presented in a second panel of the graphical user interface.

In some embodiments, the first, second, and third visual representations are presented in a second, third, and fourth panels, respectively, of the graphical user interface.

BRIEF DESCRIPTION OF THE DRAWINGS

The components in the drawings are not necessarily to scale relative to each other and like reference numerals designate corresponding parts throughout the several views:

FIG. 5 is a diagram of a comparative statistical analysis of correlation and relative difference of a comparison of the baseline and hypothetical plume stability characteristics generated for each of the plume stability characteristics, in accordance with an embodiment.

FIG. 6, comprising

Figure 10:
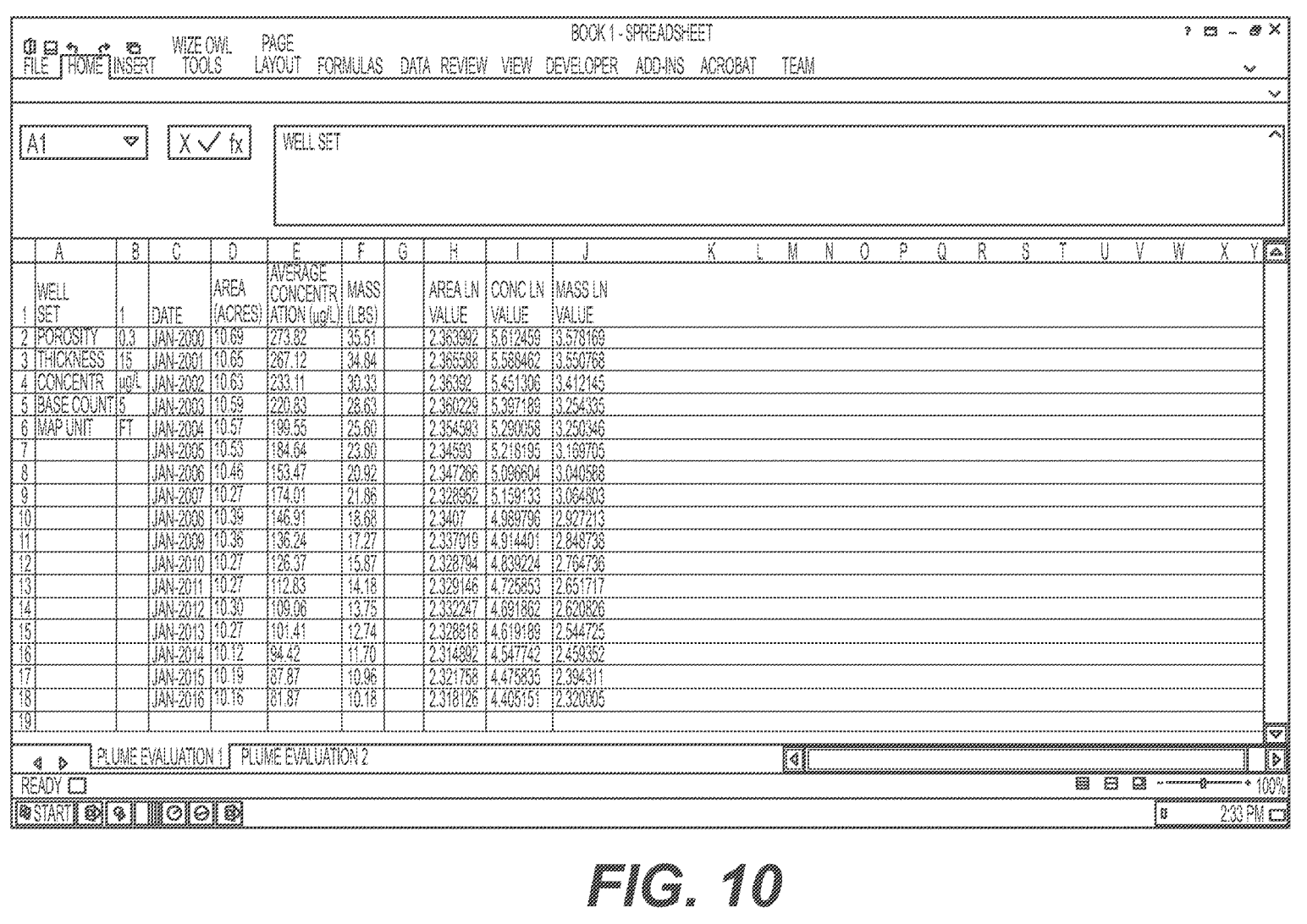
Figure 11:
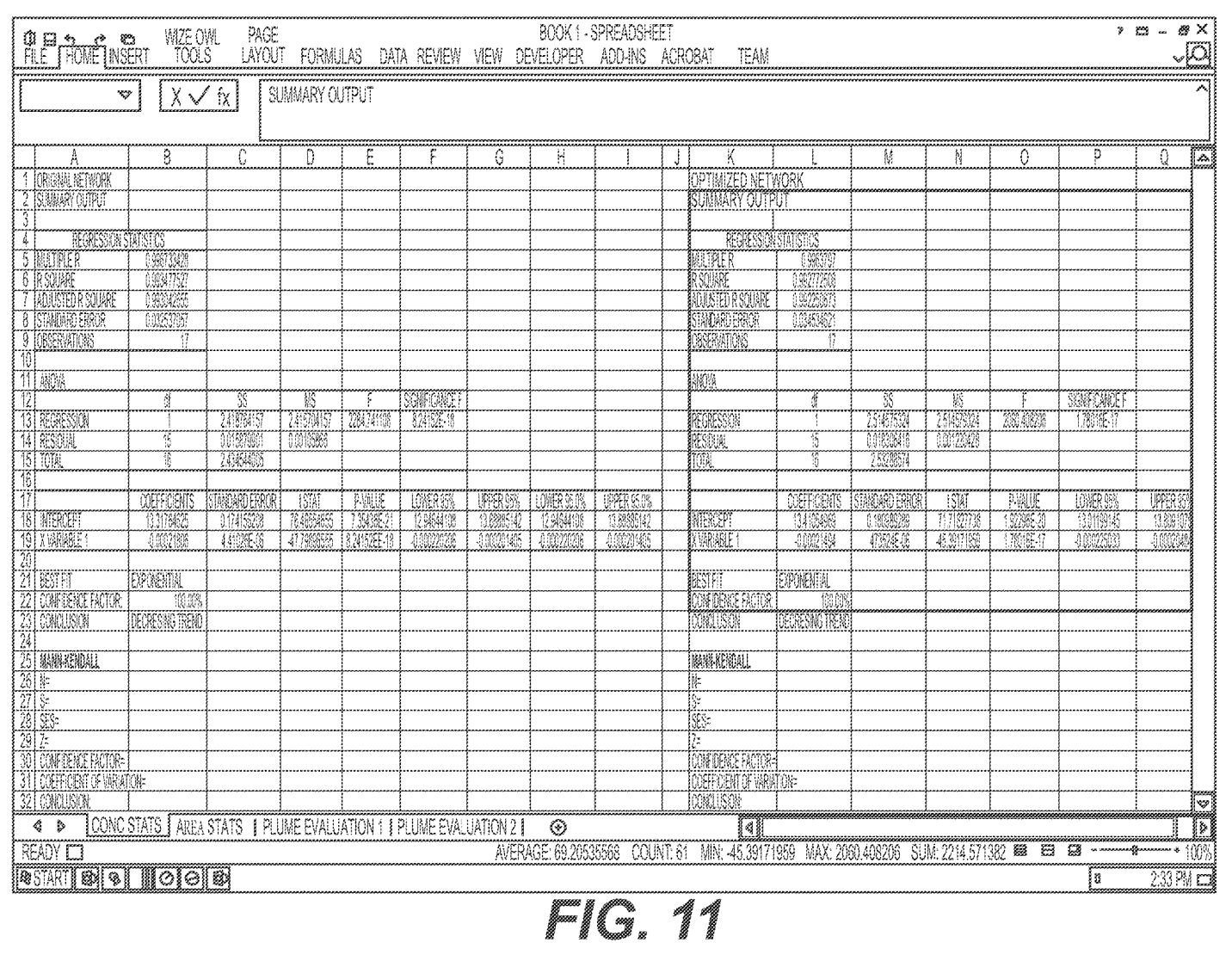
Figure 12:
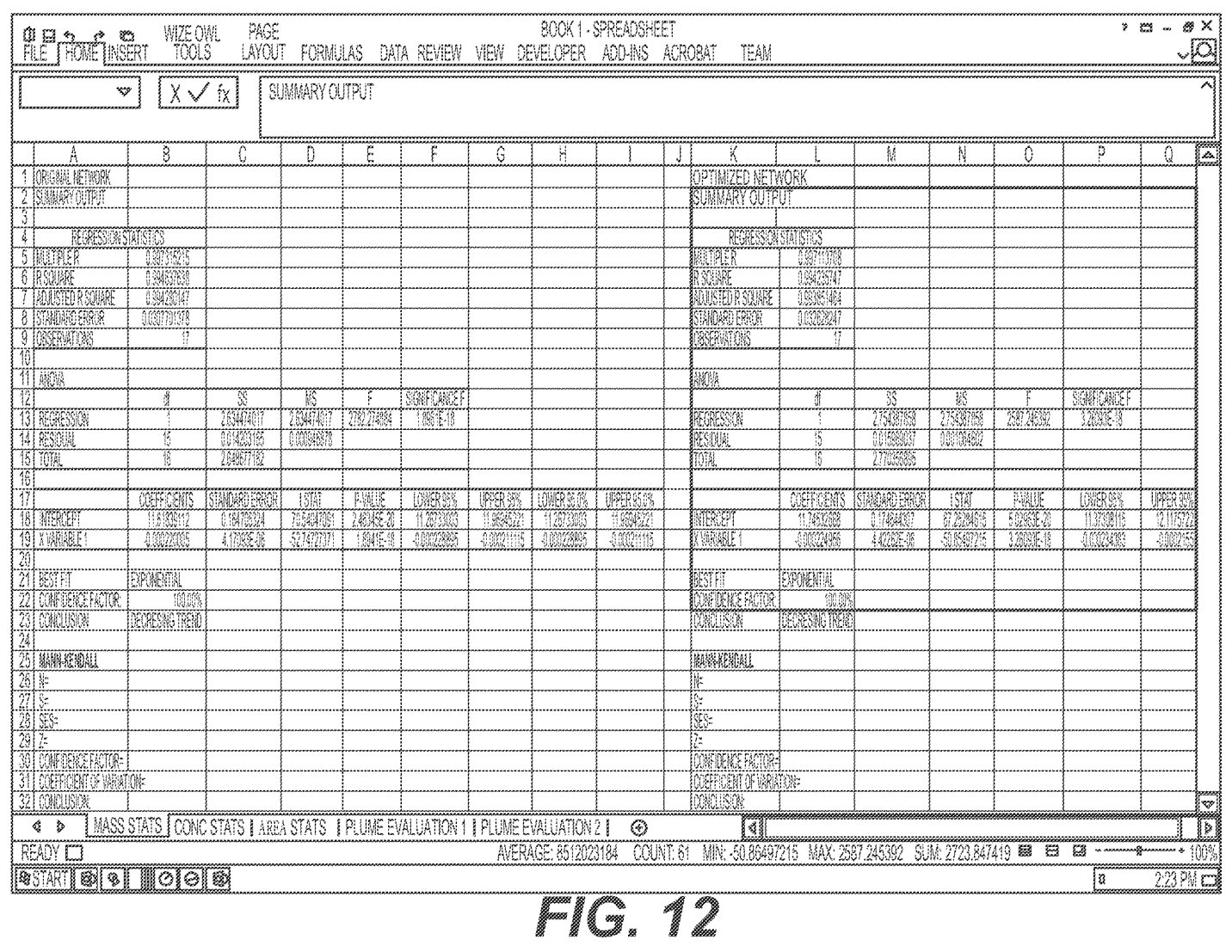

FIGS. 10, 11, 12, 13, and 14 are example generated intermediate outputs outputted in report of a baseline plume stability analysis and a subsequent plume stability analysis.

FIG. 20 illustrates an exemplary computer that can be used for executing the well sufficiency analysis tool (e.g., the Ricker Method for Well Sufficiency Analysis Tool) described herein.

DETAILED DESCRIPTION

Figure 1:
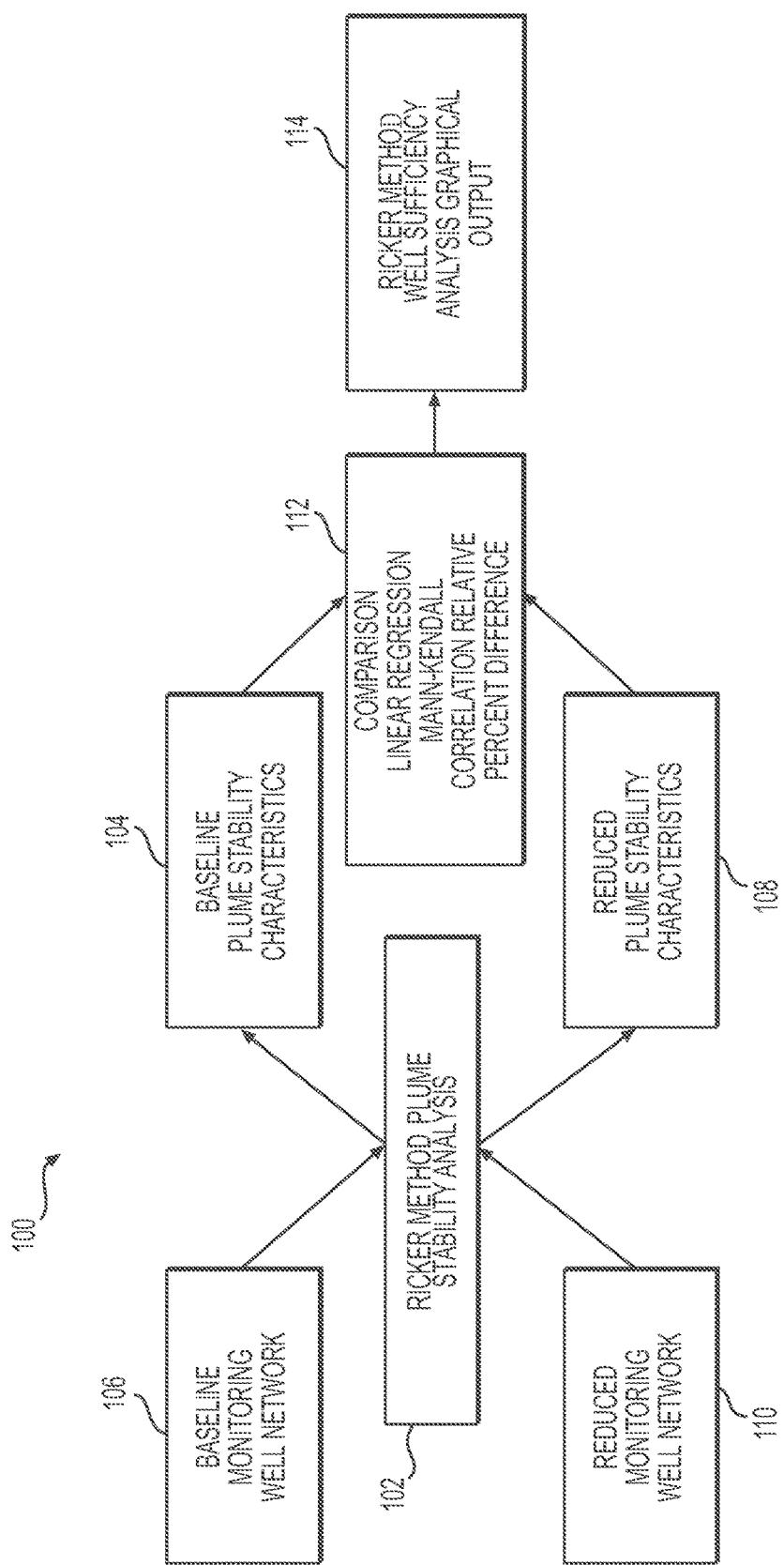
FIG. 1 is a flow chart of a method for evaluating the sufficiency or benefit of maintaining certain groundwater monitoring wells in a groundwater monitoring network, in accordance with an embodiment.

Unless defined otherwise, all technical and scientific terms used herein have the same meaning as commonly understood by one of ordinary skill in the art. Methods and materials similar or equivalent to those described herein can be used in the practice or testing of the present disclosure.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

It is understood that throughout this specification the identifiers "first", "second", "third", "fourth", "fifth", "sixth", and such, are used solely to aid in distinguishing the various components and steps of the disclosed subject matter. The identifiers "first", "second", "third", "fourth", "fifth", "sixth", and such, are not intended to imply any particular order, sequence, amount, preference, or importance to the components or steps modified by these terms.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the Examples included therein and to the Figures and their previous and following description.

Ricker Method for Well Sufficiency Analysis

FIG. 1 is a flow chart of a method 100 for evaluating the sufficiency or benefit of maintaining certain groundwater monitoring wells in a groundwater monitoring network, in accordance with an embodiment. As shown in FIG. 1, the method 100 includes applying the Ricker Method® Plume Stability Analysis (shown as 102), or a derivative or a portion thereof, to determine changes in plume average concentration, plume mass, and plume area i) for a baseline set of data for a network of monitoring wells, over time, and ii) for a hypothetical set of data for the network of monitoring wells with some changes to the monitoring condition. In some embodiments, the changes to the monitoring condition include using a reduced set of monitoring wells in the network of wells to evaluate whether certain existing groundwater monitoring wells can be abandoned/removed from a monitoring well network without having a material effect on the interpretation of groundwater plume delineation and stability (e.g., by not affecting observability of the monitoring). In some embodiments, the changes to the monitoring condition include using a reduced set of data for a given set of monitoring wells to simulate a hypothetical longer sample interval to evaluate whether the sampling frequency of a groundwater monitoring well can be reduced and still maintain the integrity of a groundwater plume stability interpretation. In some embodiments, the changes to the monitoring condition include using a reduced set of, or different, analytes for the analysis to evaluate whether the analytes being tested at a particular well can be reduced and still maintain the integrity of a groundwater plume stability interpretation.

Description of the "Ricker Method® Plume Stability Analysis" is provided in Joseph A. Ricker, "A Practical Method to Evaluate Ground Water Contaminant Plume Stability," 28 Ground Water Monitoring & Remediation, No. 4, Pages 85-94, (Fall 2008), which is incorporated by reference herein in its entirety.

As shown in FIG. 1, the method 100 to evaluate well sufficiency includes determining, using a process based on the Ricker Method® Plume Stability Analysis 102, baseline stability characteristics 104 associated with a set of grid data generated from a baseline set of wells test data 106 associated with a network of monitoring wells used to monitor plume contamination at a site. The baseline plume stability characteristics 102 includes a baseline plume area profile (e.g., an areal trend line), a baseline plume average concentration profile (e.g., an average concentration trend line), and a baseline plume mass profile (e.g., a mass trend line).

The method 100 then includes determining, using the Ricker Method Plume Stability Analysis 102, hypothetical plume stability characteristics 108 associated with a modified set of grid data generated from a modified set of wells test data 110. In some embodiments, the modified set of wells test data 110 includes a different network of monitoring wells that includes most of the monitoring wells from the baseline analysis less one or more monitoring wells. In some embodiments, the modified set of wells test data 110 includes the same network of monitoring wells, but having a reduced frequency in the monitoring interval or a different analyte that is sampled. The modified plume stability characteristics 108 includes a modified plume area profile (e.g., an areal trend line), a modified plume average concentration profile (e.g., an average concentration trend line), and a modified plume mass profile (e.g., a mass trend line).

The method 100 includes performing (step 112) a number of trend and comparative statistical analysis to determine sufficiency parameters for assessing sufficiency of the modified plume stability characteristics 102. In some embodiments, sufficiency parameters of a number of different statistical analysis techniques are used. In some embodiments, the statistical analysis includes parameters from a linear regression analysis, a Mann-Kendall test, a relative-different percent calculation, and a correlation calculation. In other embodiments, the statistical analysis includes parameters from two or more of the linear regression analysis, the Mann-Kendall test, the relative-different percent calculation, and the correlation coefficient calculation.

To generate the linear-regression-based sufficiency parameters, in some embodiments, linear regression analysis is performed on each of the baseline plume stability characteristics and on each of the modified plume stability characteristics. A relationship fit is determined for each of the baseline plume stability characteristics and for each of the modified plume stability characteristics, and corresponding relationship fits after then compared to determine whether the trend are the same or different. In some embodiments, other relationship fits (e.g., exponential, polynomial), rather than a linear fit, are applied on each of the baseline plume stability characteristics and on each of the modified plume stability characteristics. In some embodiments, the type of fits that is applied for a given plume stability characteristics is the same between corresponding baseline and modified plume stability characteristics.

To generate the Mann-Kendall based sufficiency parameter, in some embodiments, a Mann-Kendall test is performed on each of the baseline plume stability characteristics and on each of the modified plume stability characteristics. The Mann-Kendall test facilitates a statistical assessment of monotonic upward or downward trend of a variable of interest over time. A monotonic upward, or downward, trend means that the variable consistently increases (decreases) through time, but the trend may or may not be linear. The Mann-Kendall test can be used in place of a parametric linear regression analysis, which can be used to test if the slope of the estimated linear regression line is different from zero. The regression analysis requires that the residuals from the fitted regression line be normally distributed; an assumption not required by the Mann-Kendall test. That is, the Mann-Kendall test is a non-parametric, distribution-free, test.

To generate the correlation-coefficient sufficiency parameter, in some embodiments, a correlation calculation is performed on a comparison of the baseline plume stability characteristics and on each of the modified plume stability characteristics. The correlation analysis facilitates determination of a quantitative measure of some type of correlation and dependence between two or more random variables or observed data values. Examples of correlation-coefficient sufficiency parameter includes, but not limited to, the Pearson product-moment correlation coefficient, the Intra-class correlation, and the Rank correlation.

To generate the relative-different percent sufficiency parameter, in some embodiments, a relative-percent difference analysis is performed on a comparison of each of the baseline plume stability characteristics and the modified-plume stability characteristics. The relative-percent difference is calculated, in some embodiments, by Equation 1.

$$RPD = \frac{|X - Y|}{\text{Average}(X, Y)} \times 100 \qquad \text{(Equation 1)}$$

where X is a given baseline plume stability characteristic (e.g., areal value, mass value, and average concentration) and Y is a given hypothetical plume stability characteristic (e.g., corresponding areal value, mass value, and average concentration).

Examples and further description of the Mann-Kendall test, the linear regression analysis, the relative-percent difference analysis, and the correlation analysis is provided in "STATISTICAL ANALYSIS OF GROUNDWATER MONITORING DATA AT RCRA FACILITIES UNIFIED GUIDANCE," published by the Environmental Protection Agency, Document No. EPA 530/R-09-007 (March 2009), which is incorporated by reference herein in its entirety.

Referring to FIG. 1, the method 100 include generating (step 114) graphical outputs of the results from the comparison and trend analysis in step 112. An operator may compare the graphical output of the trend analysis as part of the assessment for sufficiency. The operator may directly use the graphical output of the comparison analysis in the assessment.

Discussion of Plume Stability

Evaluating the relative stability of a dissolved groundwater contaminant plume has been generating increasing attention as many state regulatory agencies, EPA and private stakeholders are realizing the applicability of plume stability as part of the environmental evaluation and/or remedial planning process of a site. Specifically, a plume stability evaluation will allow the stakeholder to assess whether a contaminant plume is stable, decreasing or increasing in size. Assessing the stability of a plume will allow the stakeholder to evaluate whether additional remedial action is necessary or whether risk-based closure of a site may be applicable or whether natural attenuation is occurring at a site. There are many other ancillary applications of plume stability evaluations as related to groundwater contamination.

The Ricker Method® of evaluating plume stability is one of the seminal works in plume stability evaluation. The method involves the evaluation of a groundwater plume in terms of areal extent, average concentration, mass indicator, and location of the plume center of mass. Specifically, in the Ricker Method®, each of the plume area, average concentration, and mass is calculated based on a gridded volume of a plume defined by a pre-defined contaminant having a pre-defined concentration (which may be expressed, e.g., as a cleanup level). In some embodiments, a plume boundary is defined to be used in a grid volume calculation. A grid volume report is generated, and the report includes, among other parameters, a positive volume and positive planar area of the grid file within the specified boundary concentration. The planar area is based on units used to generate the grid file.

The Ricker Method® plume stability analysis is especially useful and practical as an empirical evaluation of specific data (rather than a "model"). Empirical evaluations, particularly of fixed data sets, facilitate analysis results that often require minimal data interpretation and can be more easily replicated on behalf of multiple users. The Ricker Method® plume stability analysis output also provides for an eloquent and straightforward solution built confidence when evaluating the data. That is, for example, a regulator can feel more comfortable with the results of a Ricker Plume Stability Method® evaluation knowing that the output cannot be easily manipulated and can be readily replicated to provide the same results. This straightforward and reproducibility aspect of the Ricker Method® is one reason why the Ricker Method® plume stability analysis is gaining widespread acceptance in the environmental consulting and environmental regulatory arena. The Ricker Method® plume stability analysis has been accepted for use by many State regulatory agencies and EPA Region offices. It has also been highlighted as a RCRA Showcase Pilot on the EPA website. Additionally, the Ricker Method® plume stability analysis was peer-reviewed and published in the Fall 2008 edition of the Ground Water Monitoring & Remediation journal published by the National Ground Water Association (NGWA). Also, states such as New Jersey, Indiana and Missouri are incorporating the Ricker Method® plume stability analysis in their guidance for achieving risk-based closures at contaminated sites.

The Ricker Method Well Sufficiency Analysis takes the area, average concentration and mass indicator trend lines produced by a Ricker Method® plume stability analysis of a monitoring well network and uses those outputs as a baseline. In some embodiments, the exemplified methods and systems facilitates the selection of one, several, or many wells to remove from a network and to run the reduced well network through a Ricker Method® plume stability analysis to compare the outputs to the baseline analysis. The reduced well network output trend lines are then statistically compared to the baseline trend lines using liner regression, Mann-Kendall, correlation coefficients, and relative percent difference (RPD) calculations. The basis of the sufficiency analysis is that as long as the outcome of the reduced well network and/or less frequently sampled well network result in similar trend lines for all four statistical calculations, then the reduced well network and/or reduction in sampling frequency is considered adequate for continuing to evaluate the overall groundwater plume characteristics per the Ricker Method® plume stability analysis. The Ricker Method Well Sufficiency Analysis also presents graphical outputs that a practitioner can easily interpret.

Example Graphical Output of the Ricker Method Well Sufficiency Analysis

Figure 2A:
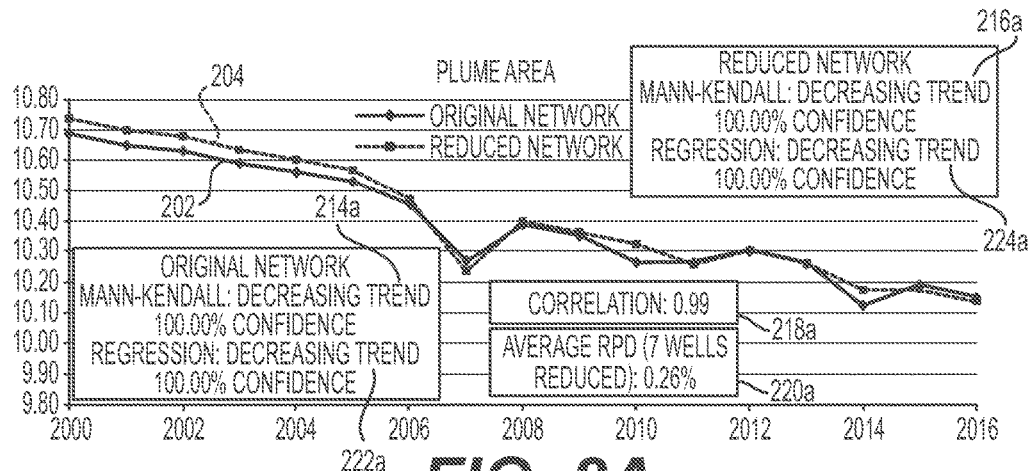
FIG. 2, comprising FIGS. 2A, 2B, and 2C, each is a diagram of an example sufficiency analysis of baseline plume characteristics and hypothetical plume stability characteristics for a network of monitoring wells.
Figure 2B:
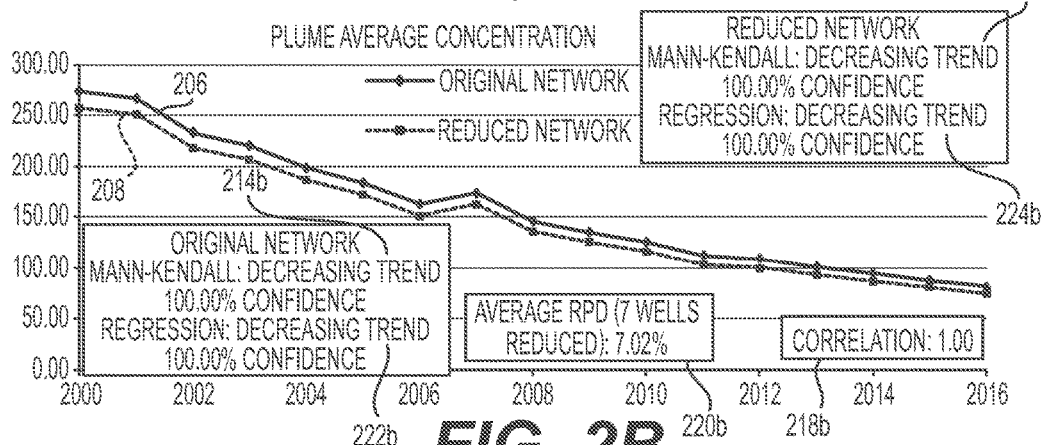
Figure 2C:
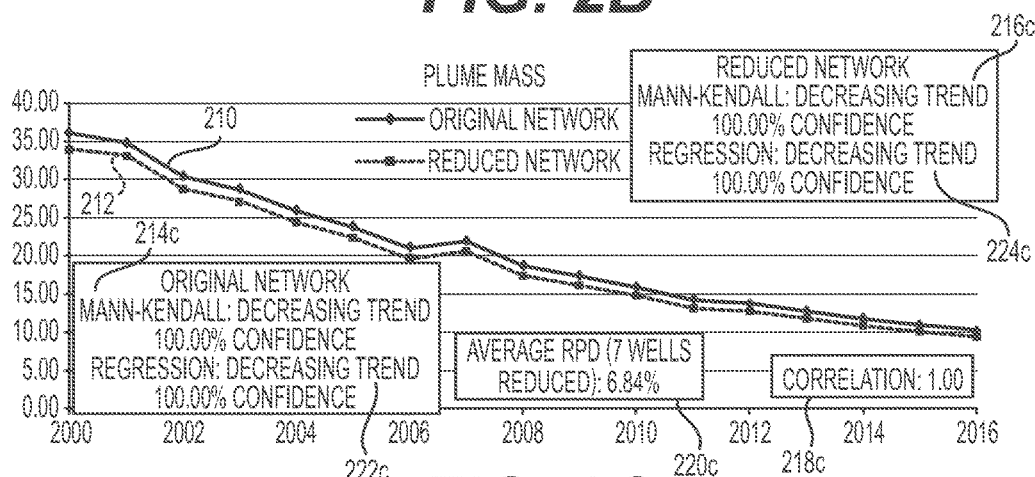

FIG. 2, comprising FIGS. 2A, 2B, and 2C, each is a diagram of an example sufficiency analysis of baseline plume characteristics and hypothetical plume stability characteristics for a network of monitoring wells. Here, the baseline plume characteristics is generated from the data of 29 monitoring wells, each sampled on a semi-annual basis. The hypothetical plume stability characteristics is generated from a modified set of this data (i.e., the same 29 monitoring wells) with data from 7 of the wells removed from the analysis.

FIG. 2A shows a baseline plume area profile 202 (e.g., a baseline plume areal trendline) and a hypothetical plume area profile 204 (e.g. a hypothetical plume areal trendline) with one or more changes to the monitoring protocol. FIG. 2B shows a plume average concentration profile 206 (e.g., a baseline plume average concentration trendline) and a hypothetical plume average concentration profile 208 (e.g., a hypothetical plume average concentration trendline) with one or more changes to the monitoring protocol. FIG. 2C shows a baseline plume mass profile 210 (e.g., a baseline plume mass trendline) and a hypothetical plume mass profile 210 (e.g., a hypothetical plume mass trendline) with one or more changes to the monitoring protocol.

As shown in FIGS. 2A, 2B, and 2C, each profile comparison includes a number of statistical parameters to determine sufficiency of monitoring and observability, including Mann-Kendall parameters 214 and 216 (shown as 214a, 214b, 214c; 216a, 216b, and 216c), correlation parameters 218 (shown as 218a, 218b, and 218c), relative percent difference parameters 220 (shown as 220a, 220b, and 220c), and regression parameters 222 and 224 (shown as 222a, 222b, 222c; 224a, 224b, and 224c).

In some embodiments, graphical outputs of the Ricker Method Well Sufficiency Analysis are configured according to FIGS. 2A, 2B, and 2C. In other embodiments, some of all of the statistical parameters are presented in tables proximal to the graphical rendering of the respective baseline and hypothetical profiles.

Table 1 illustrates example ranges and conclusions of Mann-Kendall parameters, linear regression parameters, relative-percent difference parameters, and correlation coefficient parameters for a given sufficiency argument "for" or "against" a hypothetical change to wells monitoring condition.

For example, according to Table 1, if the Mann-Kendall and Linear regressions are the same (i.e., decreasing, increasing, stable), the relative percent different is less than 10 percent, and the correlation coefficient is higher than 0.9, then the interpretative framework of the Ricker Method Well Sufficiency analysis provides that the argument to institute a given hypothetical change to the wells monitoring condition without materially affecting interpretation or observability of the measurement is "Very Strong." A similar argument is viewed, according to Table 1, as being "Strong", if the Mann-Kendall and Linear regressions are the same (i.e., both trends are the same as one another), the relative percent difference is less than 20%, and the correlation coefficient is higher than 0.8. As further shown in Table 1, the argument is viewed as only "Marginal" if the trends are not the same, but not oppositely different (e.g., one of the trends is stable and the other trend is increasing or decreasing), and/or if the relative percent difference is less than 30% or if the correlation coefficient is greater than 0.7. In addition, the argument is "Poor" if the trends are oppositely different (e.g., wherein one of the trends is increasing and the other trend is decreasing), and/or if the relative percent difference is greater than 30% or if the correlation coefficient is less than 0.7.

TABLE 1

Ricker Method Well Sufficiency Argument

| Strength of Argument | Mann-Kendall | Linear Regression | Relative Percent Difference | Correlation Coefficient |
|---|---|---|---|---|
| Very Strong | Same | Same | <10% | >0.9 |
| Strong | Same | Same | <20% | >0.8 |
| Marginal | Increasing/Stable or Decreasing/Stable | Increasing/Stable or Decreasing/Stable | <30% | >0.7 |
| Poor | Increasing/Decreasing | Increasing/Decreasing | >30% | <0.7 |

It should be appreciated that the table may be modified without departing from the spirit of the disclosure. It is contemplated that the table may be modified, for example, but not limited to, based on the types of contaminant plumes, historical data, and stakeholder auditing and regulatory assessment processes.

Figure 3:
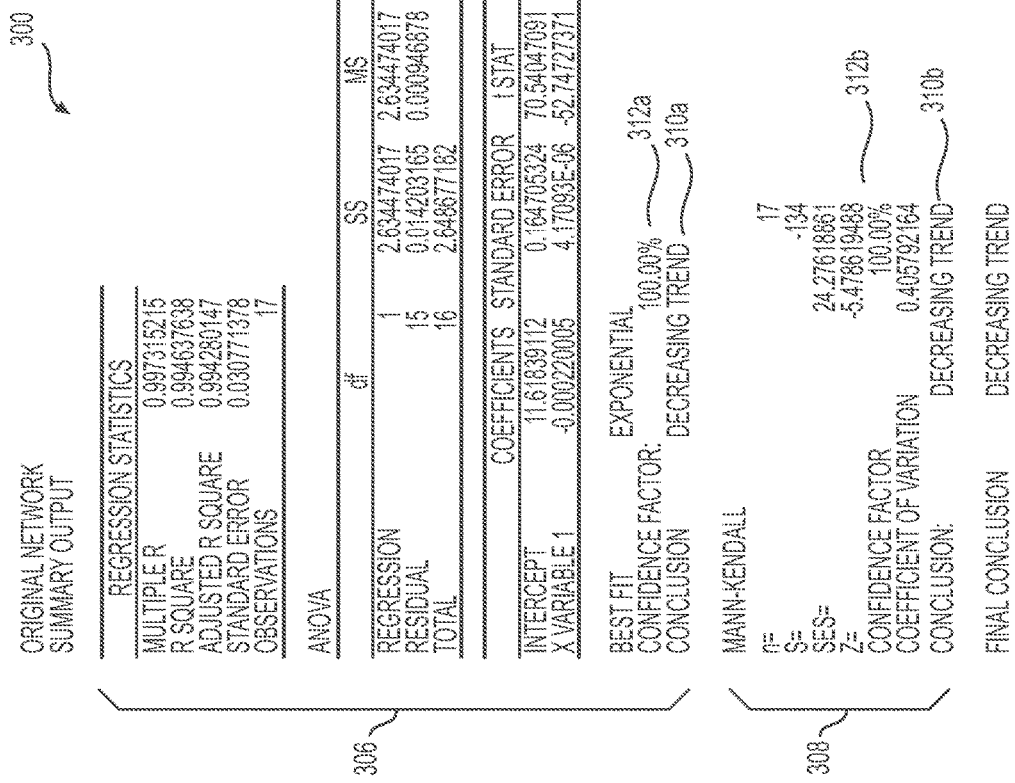
FIG. 3 is a diagram of a trend statistical analysis of an example baseline analysis and an example hypothetical analysis of the profiles data shown in FIGS. 2A, 2B, and 2C.
Figure 4:
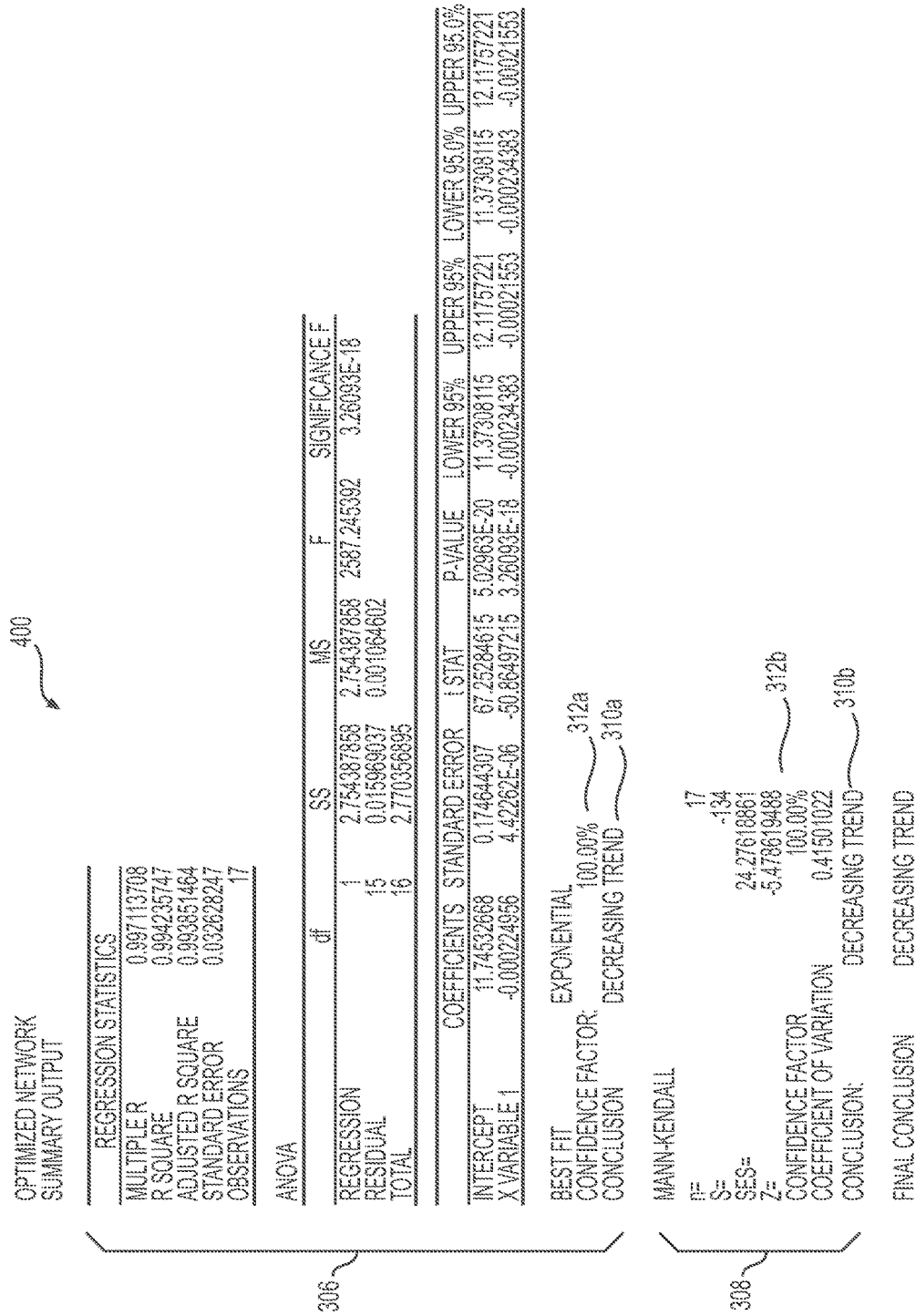
FIG. 4 is a diagram of a trend statistical analysis for a set of hypothetical plume stability characteristics generated from a plume stability analysis, in accordance with an embodiment.

FIGS. 3-4 are diagrams of a trend statistical analysis of an example baseline analysis 300 and an example hypothetical analysis 400 of the profiles data shown in FIGS. 2A, 2B, and 2C. In some embodiments, a graphical output (e.g., 300 and 400) of trend statistical analysis is generated for each of plume stability characteristics determined from the plume stability analysis (e.g., the baseline plume mass profile, baseline plume average concentration profile, baseline plume areal profile, hypothetical plume mass profile, hypothetical plume average concentration profile, and hypothetical plume areal profile).

As shown in FIGS. 3 and 4, the trend statistical analysis for each plume stability characteristics, in some embodiments, includes the regression analysis and Mann-Kendall analysis for the baseline plume stability characteristics (e.g., 202, 206, 210) and for the hypothetical plume stability characteristics (e.g., 204, 208, and 212). Specifically, FIG. 3 presents the trend statistical analysis for the baseline plume areal trend line; and FIG. 4 presents the trend statistical analysis for the hypothetical plume areal trend line.

Referring still to FIGS. 3 and 4, each graphical output includes a regression analysis component 306 and a Mann-Kendall analysis component 308, of data for a given network of monitoring wells. The output of each of the regression analysis and Mann-Kendall analysis includes a conclusion value 310 (shown as 310a and 310b) corresponding to a trend (e.g., increasing, stable, unstable, and decreasing) of a given trend line and an associated confidence value 312 (shown as 312a and 312b) of the conclusion. In some embodiments, the conclusion value 310 and confidence value 312 of a given profile data is graphically presented in the main graphical outputs of the Ricker Method Well Sufficiency Analysis shown in relation to FIGS. 2A, 2B, and 2C. For example, in FIGS. 2A, 2B, and 2C, the conclusion value 310 and confidence value 312 are presented as the Mann-Kendall parameters (214a, 214b, 214c and 216a, 216b, 216c) and the regression parameters (222a, 222b, 222c and 224a, 224b, 224c).

FIG. 5 is a diagram of a comparative statistical analysis 500 of correlation and relative difference of a comparison of the baseline and hypothetical plume stability characteristics generated for each of the plume stability characteristics, in accordance with an embodiment. In some embodiments, a single graphical output includes all compared statistical analysis for the baseline and hypothetical plume stability characteristics. In other embodiments, the compared statistical analysis are presented in multiple graphical outputs.

As shown in FIG. 5, a graphical output of the comparative statistical analysis 500 may include a correlation analysis component 502 (shown as 502a, 502b, and 502c) and a relative percent difference analysis 504 (shown as 504a, 504b, and 504c) between the baseline and hypothetical plume stability characteristics for each of the plume stability characteristics. Specifically, the graphical output may include an areal correlation parameter 502a between the baseline plume areal trendline (e.g., 202) and the hypothetical areal trendline (e.g., 204), an average-concentration correlation parameter 502b between the baseline plume average-concentration trendline (e.g., 206) and the hypothetical average-concentration trendline (e.g., 208), and a mass correlation parameter 502c between the baseline plume mass trendline (e.g., 210) and the hypothetical mass trendline (e.g., 212). The areal, average-concentration, and mass correlation parameters (502a, 502b, 502c) may be presented in the correlation parameters (218a, 218b, 218c) described in relation to FIG. 2.

Referring still to FIG. 5, the graphical output 500 includes an areal relative-percent difference parameter 504a between the baseline plume areal trendline (e.g., 202) and the hypothetical areal trendline (e.g., 204), an average-concentration relative-percent difference 504b between the baseline plume average-concentration trendline (e.g., 206) and the hypothetical average-concentration trendline (e.g., 208), and a mass relative-percent difference 504c between the baseline plume mass trendline (e.g., 210) and the hypothetical mass trendline (e.g., 212). The areal, average-concentration, and mass relative-percent difference (504a, 504b, 504c) may be presented as the relative-percent difference parameters (220a, 220b, 220c) described in relation to FIG. 2.

FIG. 5 also presents an analysis 506 of difference between the baseline and hypothetical trend lines for each of the plume stability characteristics (e.g., areal, average concentration, and mass). In addition, FIG. 5 presents a modification parameter 508 associated with a change between the baseline data and the hypothetical data used in the analysis. As shown in FIG. 5, removal of 7 monitoring wells from the baseline set of monitoring wells constitute the change between the two plume stability analysis.

Example Network of Monitoring Wells

Figure 6A:
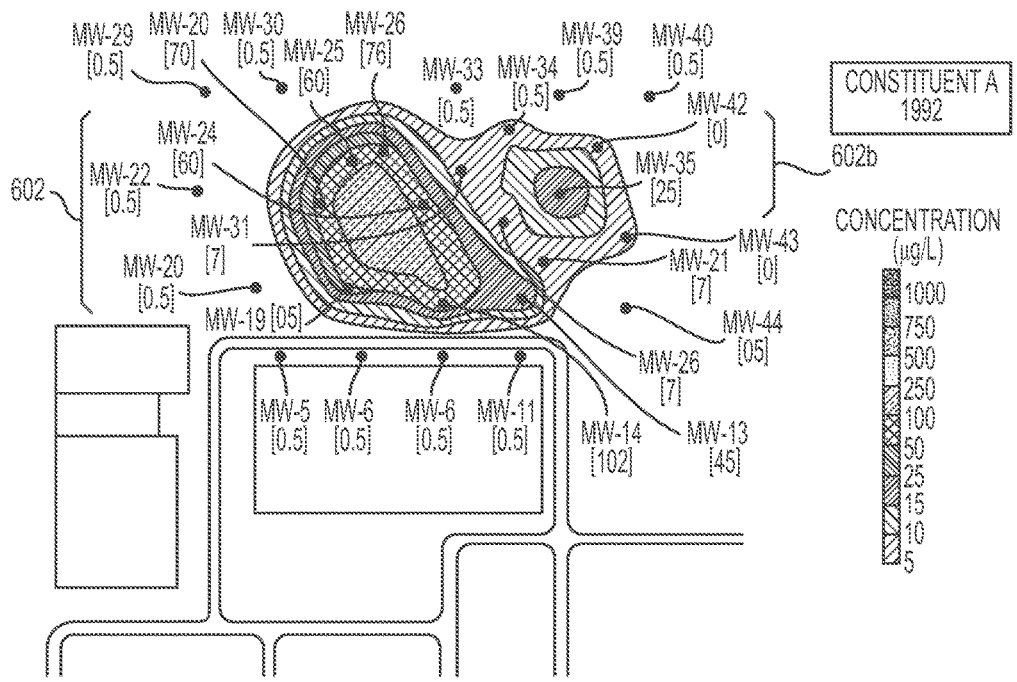
FIGS. 6A, 6B, 6C, 6D, are diagrams of an example network of monitoring wells of a contamination plume at a site, in accordance with an embodiment.
Figure 6B:
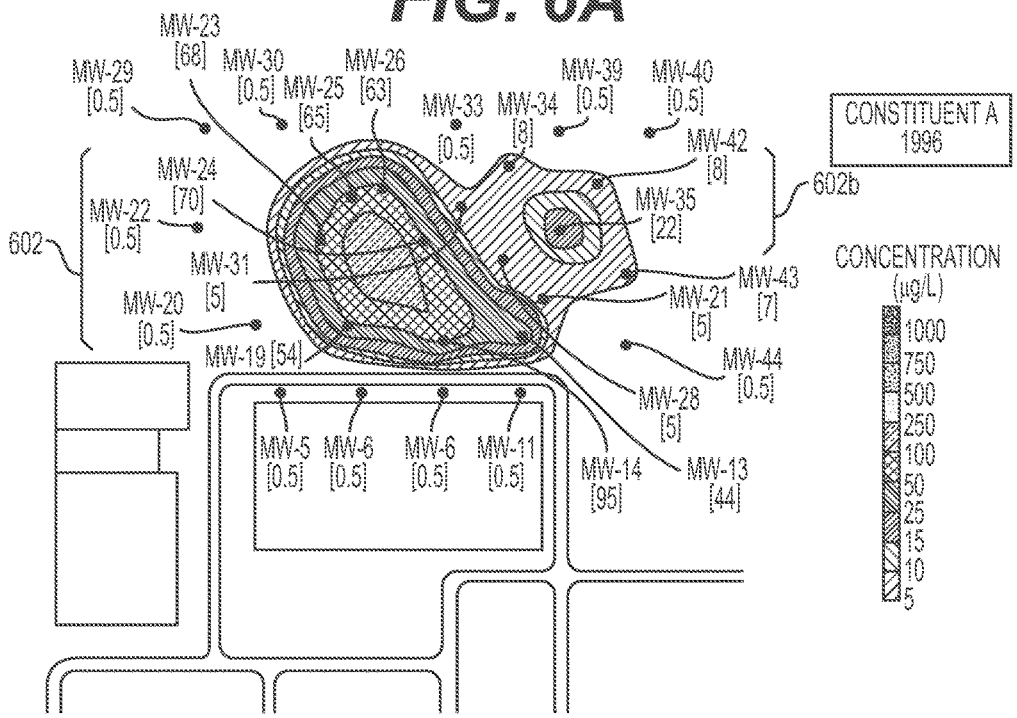
Figure 6C:
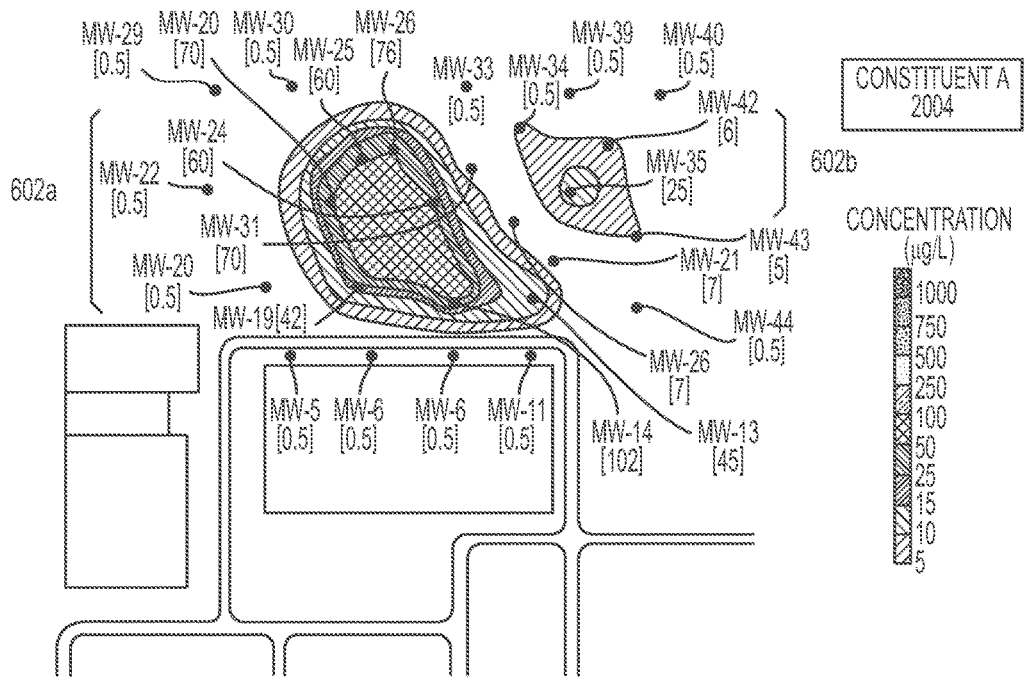
Figure 6D:
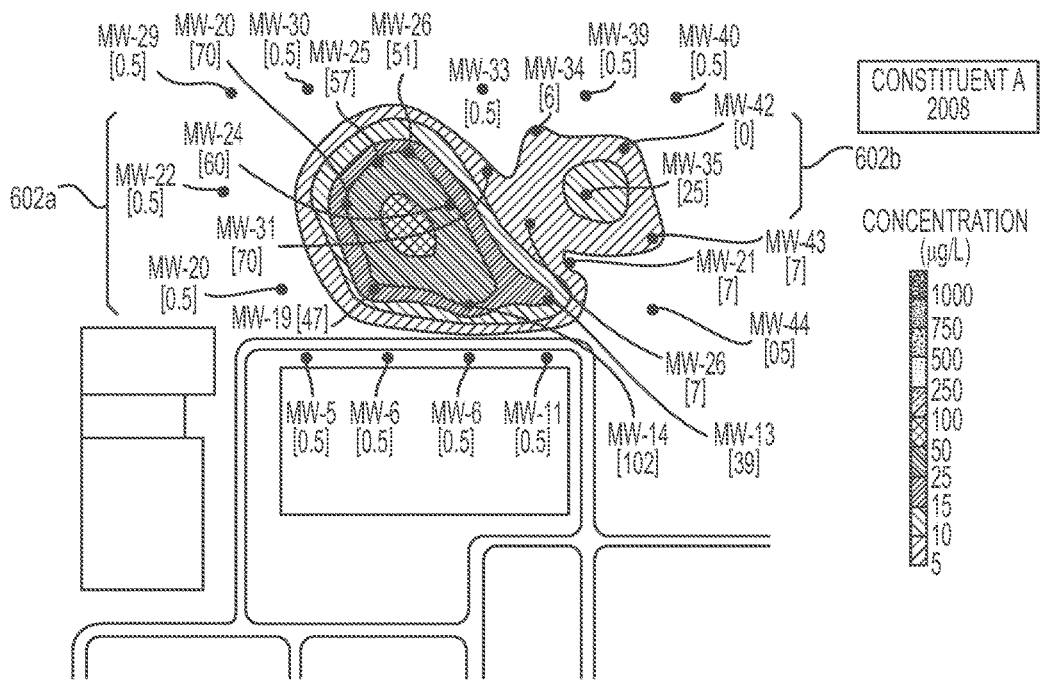

FIG. 6, comprising FIGS. 6A, 6B, 6C, 6D, are diagrams of an example network of monitoring wells of a contamination plume at a site, in accordance with an embodiment. It is noted that the data shown in FIG. 6 is not presented in FIGS. 2, 3, 4, and 5. FIG. 6 illustrate, graphically, the complexity associated with plume stability analysis and wells monitoring. As shown in FIG. 6A, a contamination plume 602 of a given site may have multiple areas of contamination (shown as contaminated area 602a and 602b).

The size, location, extent, and degree of contamination, often varies and changes with time; and thus, removal of monitoring wells and/or changing monitoring conditions may affect observability and the sufficiency of the measurement. As an example of the dynamic aspect of monitoring, as shown in FIGS. 6A-6D, a network of monitoring wells (shown as "WM-5", "WM-6", "WM-8", "WM-11", "WM-13", "WM-14", "WM-19", "WM-20", "WM-21", "WM-22", "WM-23", "WM-24", "WM-25", "WM-26", "WM-28", "WM-29", "WM-30", "WM-31", "WM-33", "WM-34", "WM-35", "WM-39", "WM-40", "WM-41", "WM-42", "WM-43", and "WM-44", among others) has been established at the site to monitor the contamination. As shown, for example, in FIGS. 6A, 6B, and 6C, contamination at areas 602a and 602b appears to be reducing with the area of contaminant shrinking and the concentration levels of the contamination diminishing, from year 1992 to 2004. At year 2004, it appears that monitoring at MW-31, MW-28, and MW-21 may not be necessary or reduced because the contamination no longer appears to be recorded there. However, at year 2008 (FIG. 6D), the contamination at area 602a and 602b appears to have moved over a region of previously contaminated area 606. If monitoring wells (e.g., "WM-31", "WM-28", or "WM-21" among others) have been removed at area 606, the observability and interpretation of the measurement could have been materially affected.

Example Well Sufficiency Analysis Tool

Figure 7:
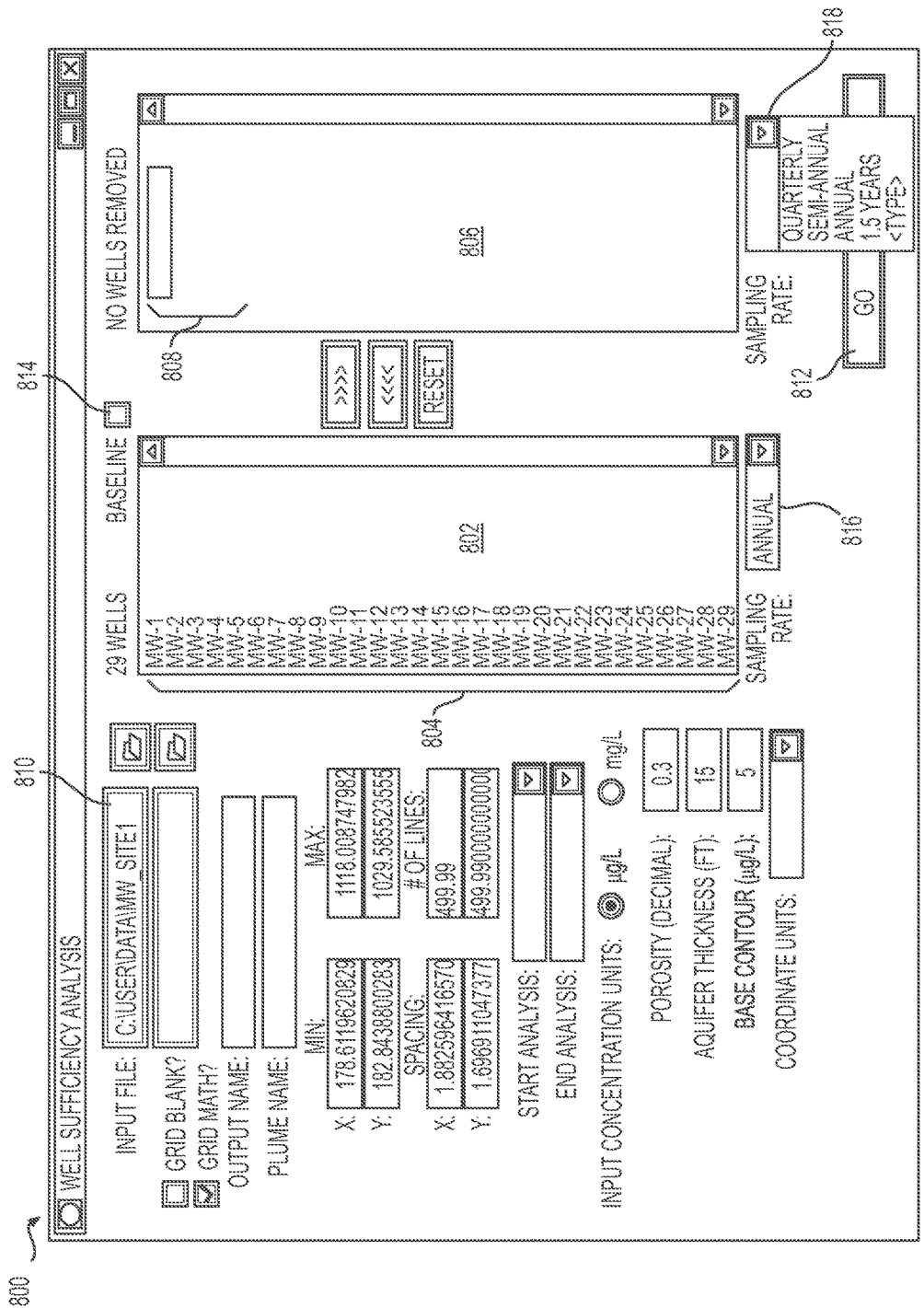
FIG. 7 is a diagram of a graphical user interface (GUI) of a well-sufficiency analysis tool, in accordance with an embodiment.

FIG. 7 is a diagram of a graphical user interface (GUI) 800 of a well-sufficiency analysis tool, in accordance with an embodiment.

The graphical user interface 800 provides a flexible and user-intuitive interface to determine baseline plume characteristics and hypothetical plume stability characteristics, for a network of monitoring wells, to determine the sufficiency of the plume stability measurement with changes to the monitoring conditions (e.g., by reducing number of monitoring wells, reducing frequency of sampling, and/or changing or reducing analytes in the analysis) and to generate graphical outputs that are comprehensive and intuitive to interpret.

The graphical user interface 800 includes a first panel 802 that presents a plurality of graphical objects 804 each associated with data of a monitoring well to be included in a baseline plume stability analysis (e.g., using the Ricker Method Plume Stability Analysis). The graphical user interface 800 includes a second panel 806 that presents a plurality of graphical objects 808 associated with removal of one or more wells from the baseline plume stability analysis, for generating a hypothetical plume stability analysis. The graphical user interface 800 may receive the data for the analysis via an input file field 810. The graphical user interface 800 includes an execution widget 812 (shown as "Go" 812) that upon its selection, executes plume stability analysis for wells data of wells listed in pane 802.

Figure 8:
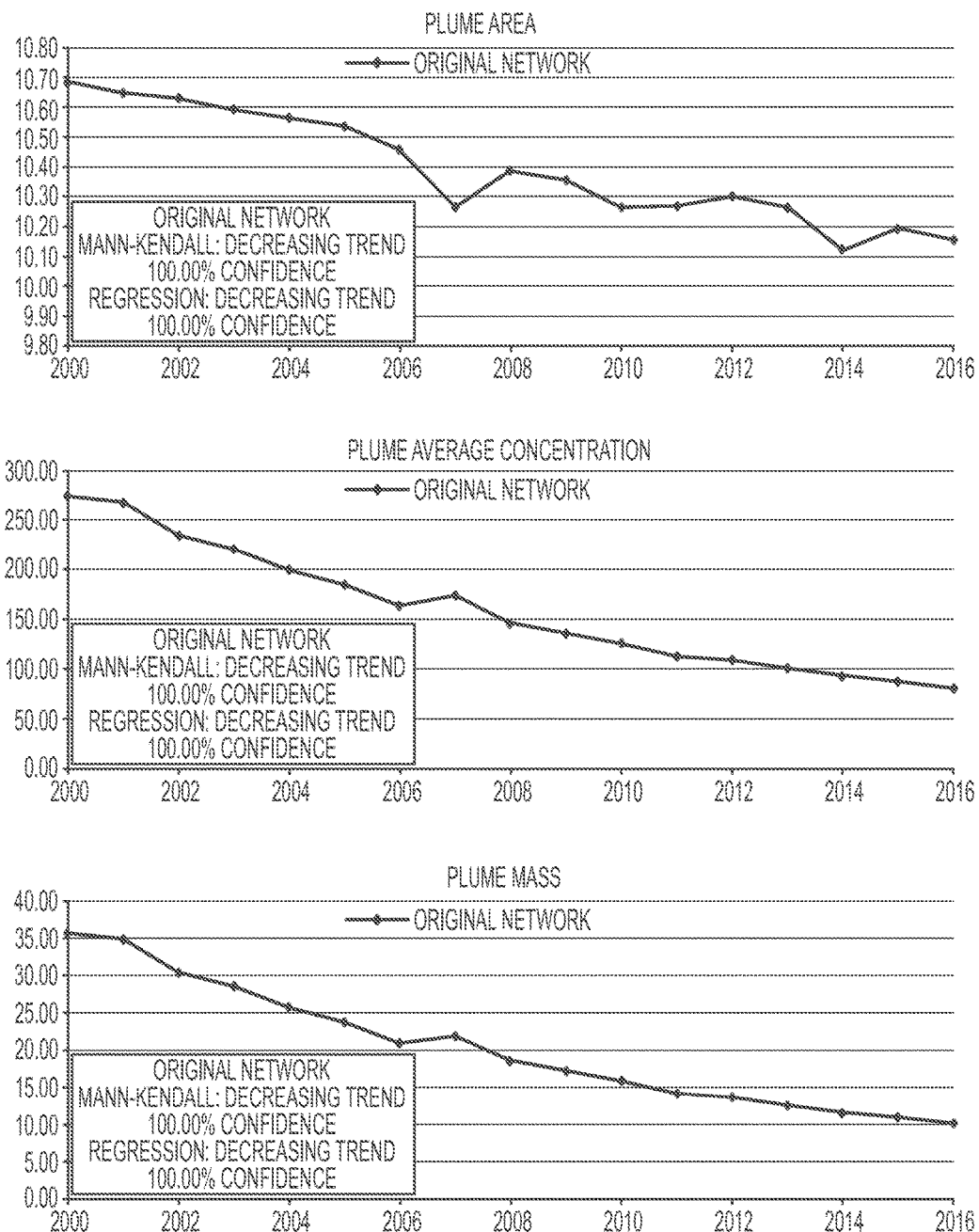
FIG. 8 is a diagram of an example graphical output of a baseline plume area trend line, a baseline plume average concentration trend line, and a baseline plume mass trend line generated by the graphical user interface, in accordance with an embodiment.

FIG. 8 is a diagram of an example graphical output of a baseline plume area trend line, a baseline plume average concentration trend line, and a baseline plume mass trend line generated by the graphical user interface 800, in accordance with an embodiment. FIG. 8 is an example of a graphical output of a sufficiency analysis when the baseline set of monitoring wells or conditions is analyzed (e.g., when all the wells are selected for analysis and none are removed). In should be appreciated that baseline plume stability analysis may be performed from a set of monitoring wells in which one or more monitoring wells are removed from the analysis (i.e., in being placed in pane 806). In certain instances, it may be desired that certain outlier wells are removed from a given baseline plume stability analysis. To this end, in some embodiments, the GUI may include, e.g., a widget to facilitate designation of a given set of wells for a baseline analysis.

Figure 9:
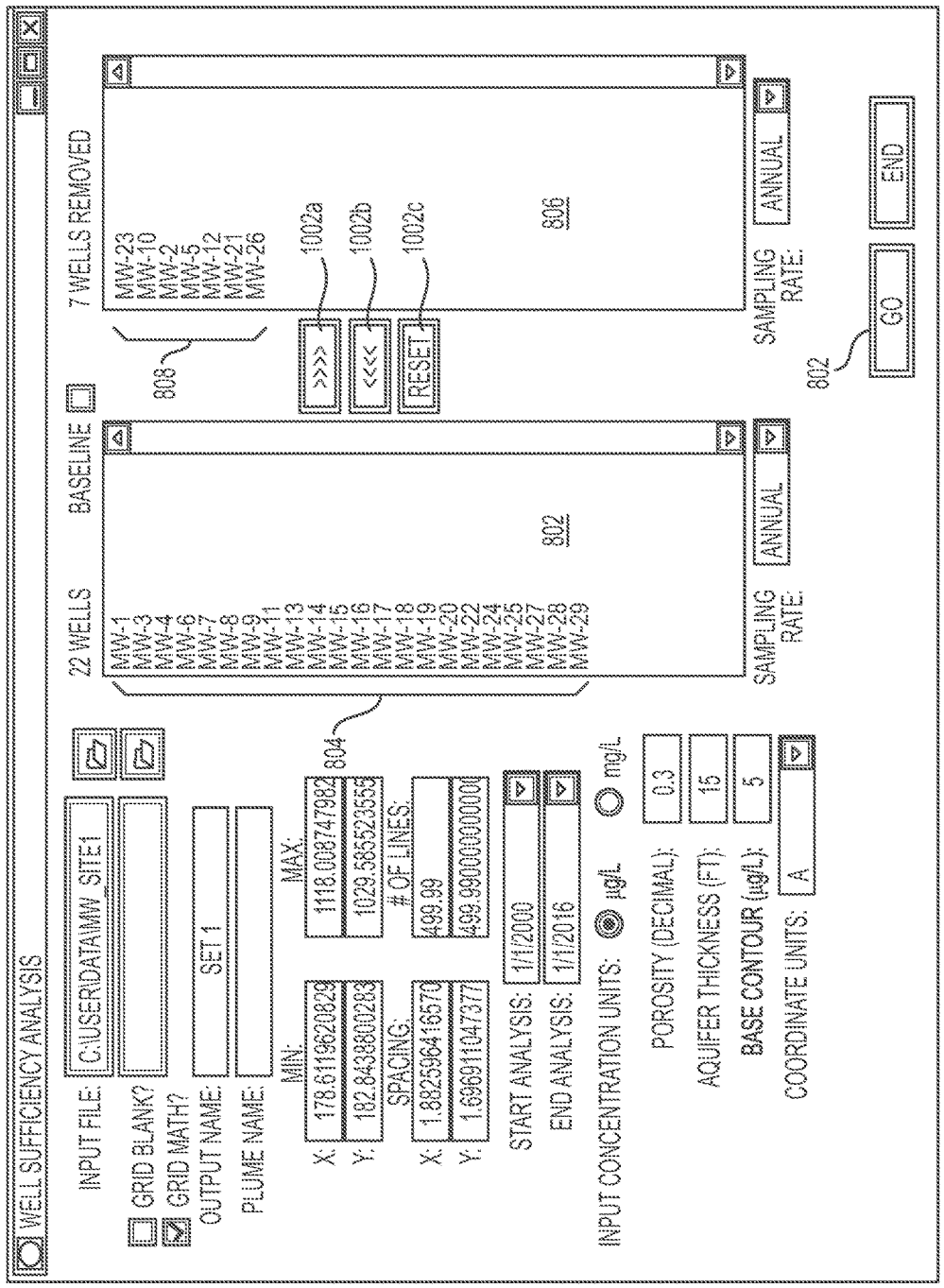
FIG. 9 is a diagram of the graphical user interface of FIG. 7 with selection of analysis condition to execute a hypothetical plume stability analysis, in accordance with an embodiment.
Figure 13:
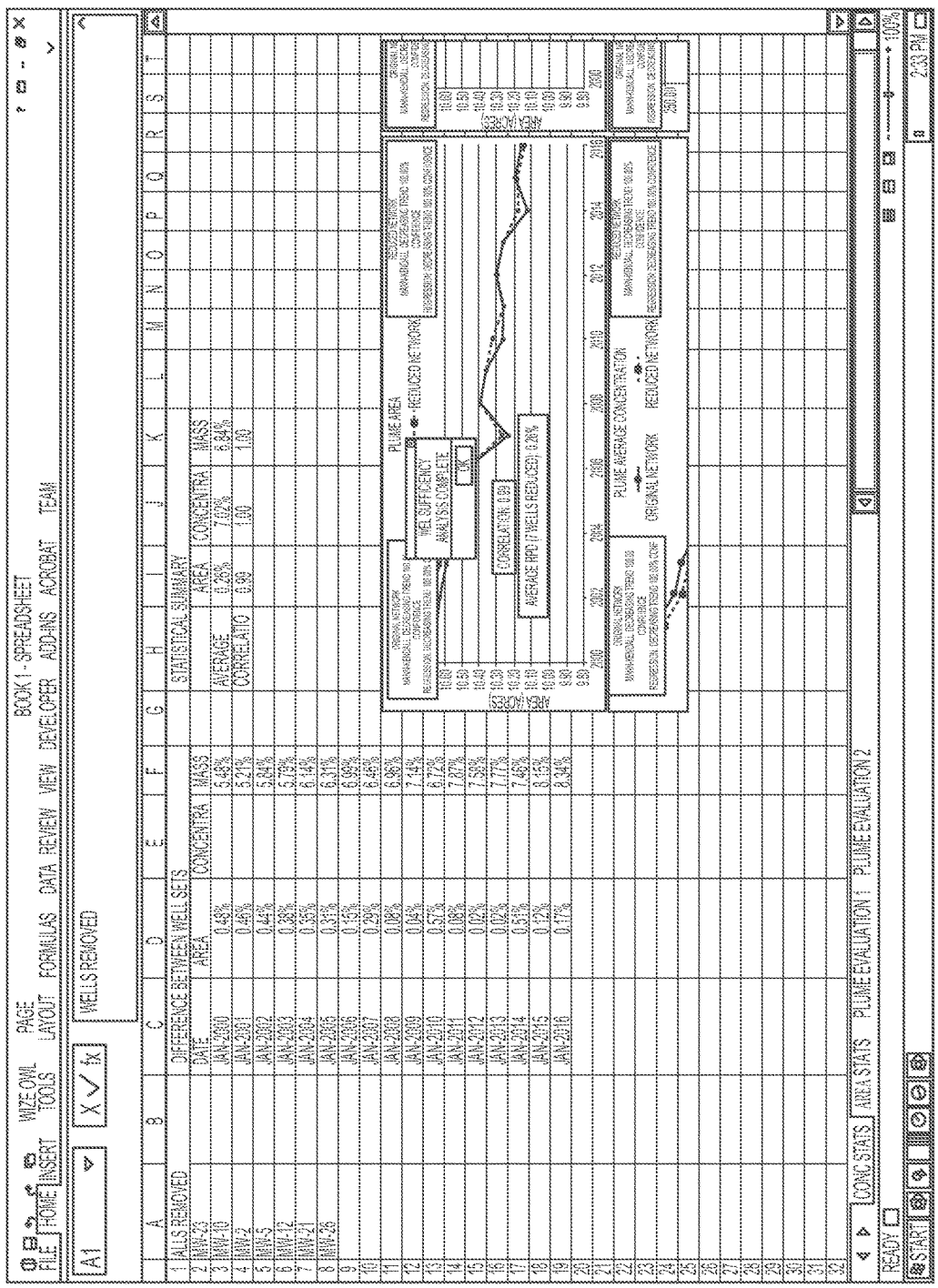

FIG. 9 is a diagram of the graphical user interface 800 of FIG. 7 with selection of analysis condition to execute a hypothetical plume stability analysis, in accordance with an embodiment. As shown in FIG. 9, the first pane 802 includes a modified list of graphical objects 804 corresponding to a modified set of wells to generate the hypothetical plume stability characteristics to be compared, in a well sufficiency analysis, to the baseline plume characteristics. Here, the modified list includes 22 wells corresponding to 22 data objects 804. In the second pane 806, a set of 7 wells (corresponding to data objects 808) are presented. The set of removed wells (i.e., those shown in second pane 806) may be moved between the first and second pane (802, 806) via add and remove widgets 1002 (shown as remove ">>>>" widget 1002a, add "<<<<" widget 1002b, and "Reset" widget 1002c). The remove widget 1002, upon selection, causes the GUI 800, to move an object (e.g. 802) from pane 802 to pane 806. The add widget 1002b, upon selection, causes the GUI 800, to move an object (e.g., 806) from pane 806 to pane 802. In effect, the remove widget 1002a configures a modified set of data to be analyzed in the hypothetical plume stability analysis that deviates from the baseline plume stability analysis. The add widget 1002b configures the modified set of data such that it is more consistent with the data set used in the baseline plume stability analysis, thereby providing finer and granular control of the analysis. The "reset" widget 1002c configures the modified set of data to a default data set same as in the baseline plume stability analysis.

Upon selection of the execute widget 802, the GUI 800 is configured to perform a subsequent plume stability analysis and to compare the hypothetical plume stability characteristics generated therefrom to the baseline plume characteristics (e.g., for a set of wells generated in relation to FIG. 7). Multiple subsequent plume sufficiency analysis may be performed in consecutive order, for example, a second plume stability analysis, a third plume stability analysis, etc., in which each hypothetical plume stability characteristics generated in the subsequent analysis is compared to the baseline plume stability characteristics.

Figure 14:
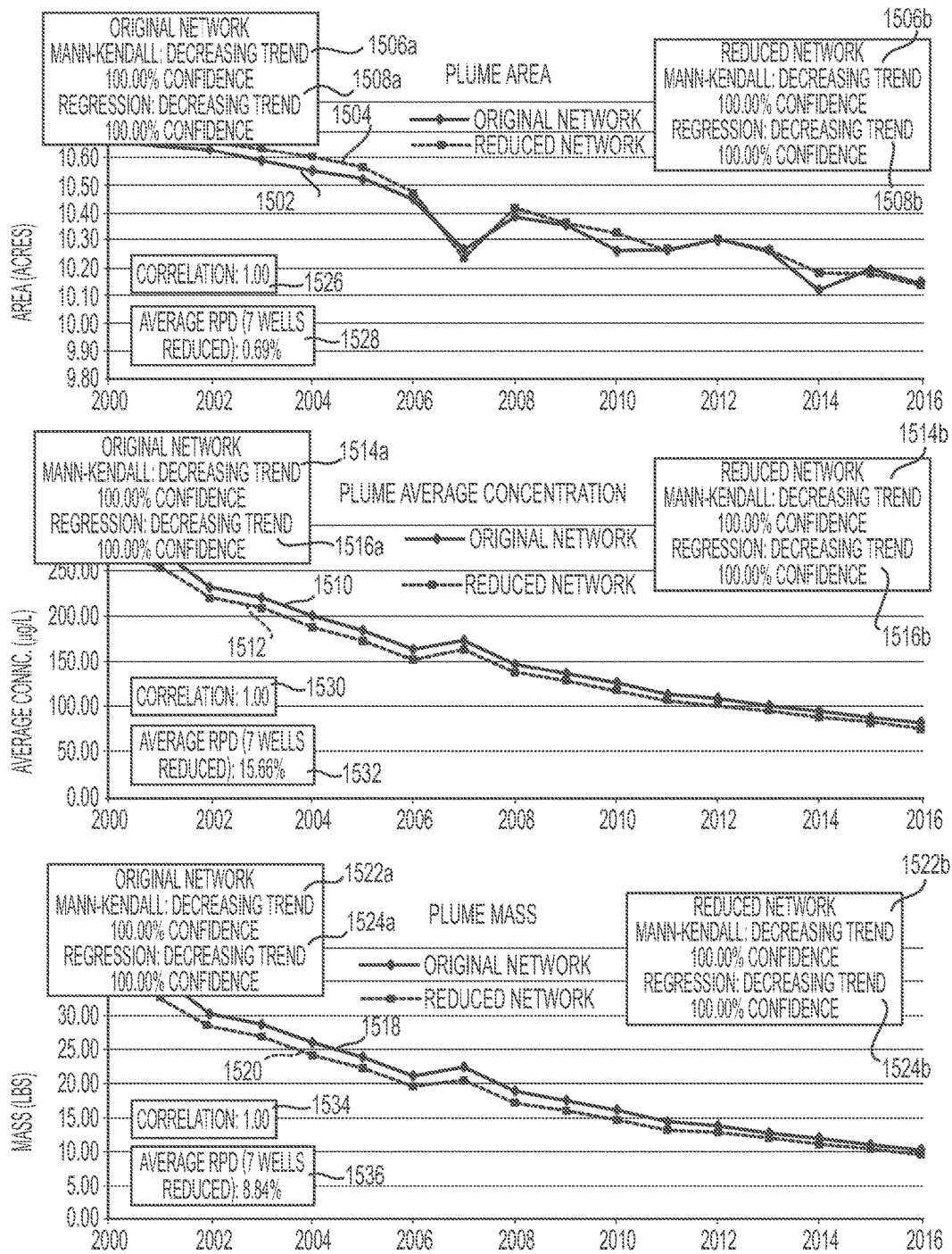

In some embodiments, the GUI 800 is configured to generate intermediate outputs in a report (e.g., an Excel report or a spreadsheet report) of baseline plume stability analysis, the one or more subsequent plume stability analysis, and the trend and comparative statistical analysis thereof. FIGS. 10, 11, 12, 13, and 14 are example intermediate outputs created in a spreadsheet report. FIG. 14, in particular, is a graphical output of the baseline plume characteristics and hypothetical plume stability characteristics for a baseline set of wells comprising 29 wells data and a hypothetical set of wells comprising 22 wells data (i.e., 7 wells data removed). As shown in FIG. 14, the trend for each of the baseline plume area trendline 1502 and the hypothetical plume area trendline 1504 is decreasing, as observed via the plot 1502, 1504 and via the Mann-Kendall parameters 1506a, 1506b and regression parameters 1508a, 1508b. Further shown in FIG. 14, the trend for each of the baseline plume average concentration trendline 1510 and the hypothetical plume average concentration trendline 1512 is decreasing via the plot 1510, 1512 and via the Mann-Kendall parameters 1514a, 1514b and the regression parameters 1516a, 1516b. Further shown in FIG. 14, the trend for each of the baseline plume mass trendline 1518 and the hypothetical plume mass trendline 1520 is decreasing via the plot 1518, 1520 and via the Mann-Kendall parameters 1522a, 1522b and the regression parameters 1524a, 1524b. FIG. 14 also shows a correlation parameter 1526 and an average relative percent-difference parameter 1528 associated with the comparison between the baseline plume areal trend line 1502 and the hypothetical plume areal trend line 1504. FIG. 14 also shows a correlation parameter 1530 and an average relative percent-difference parameter 1532 associated with the comparison between the baseline plume average concentration trend line 1510 and the hypothetical plume average concentration trend line 1512. FIG. 14 further shows a correlation parameter 1534 and an average relative percent-difference parameter 1536 associated with the comparison between the baseline plume mass trend line 1518 and the hypothetical plume mass trend line 1520. Because all the Mann-Kendall parameters and regression parameters are the same (i.e., decreasing); all of the correlation parameters having a value greater than 0.9; and all the average relative-percent difference being less than 10%, according to Table 1—there is a "Very Strong" argument that the removal of the 7 wells (namely, "MW-23", "MW-10", "MW-2", "MW-5", "MW-12", "MW-21", and "MW-26" as shown in relation to FIG. 9) from the monitoring of the plume at this site does not materially affect the sufficiency and observability of the plume measurement.

Figure 15:
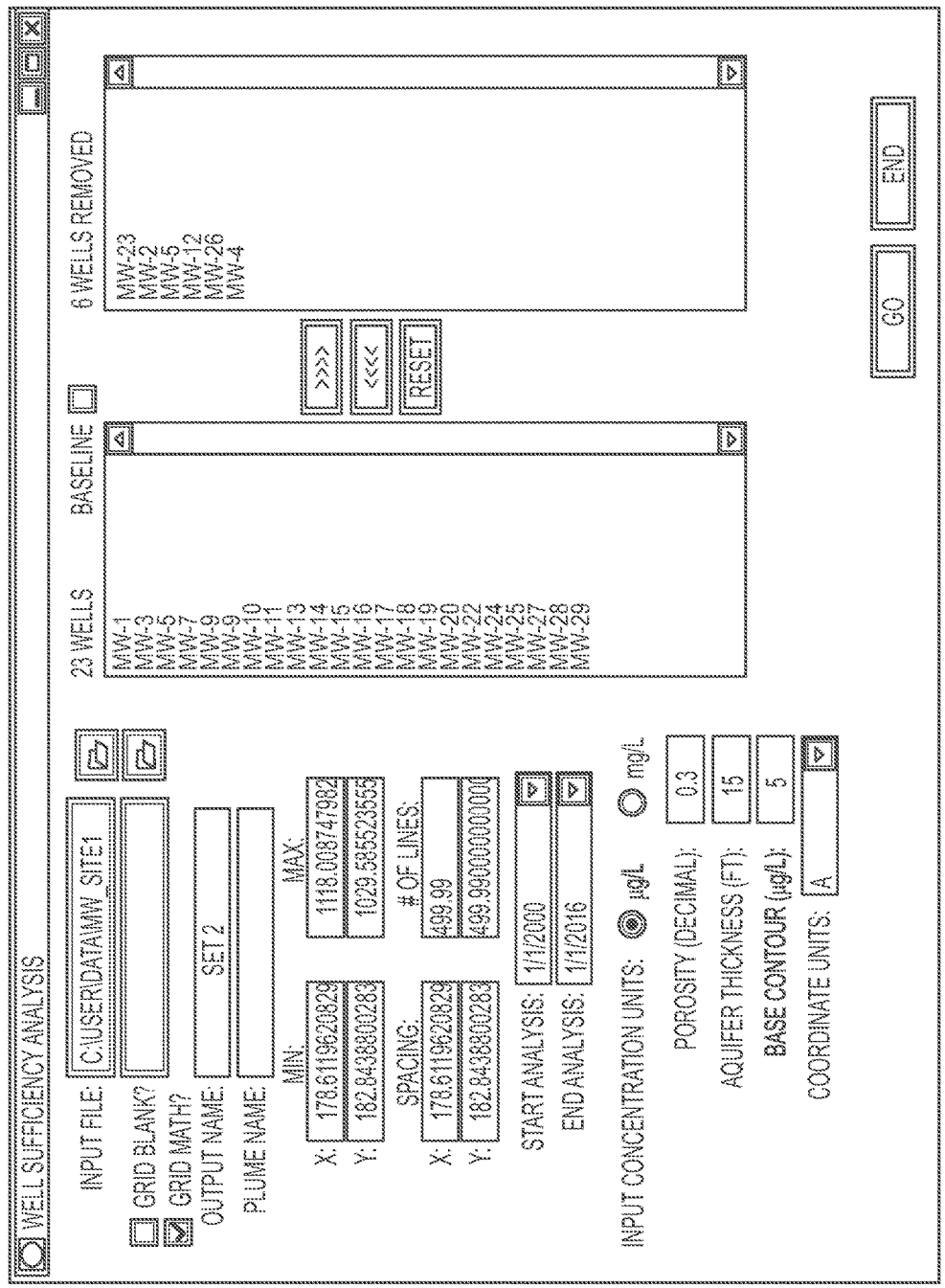
FIGS. 15 and 16 show a second well sufficiency analysis performed a second set of hypothetical network of monitoring wells.
Figure 16:
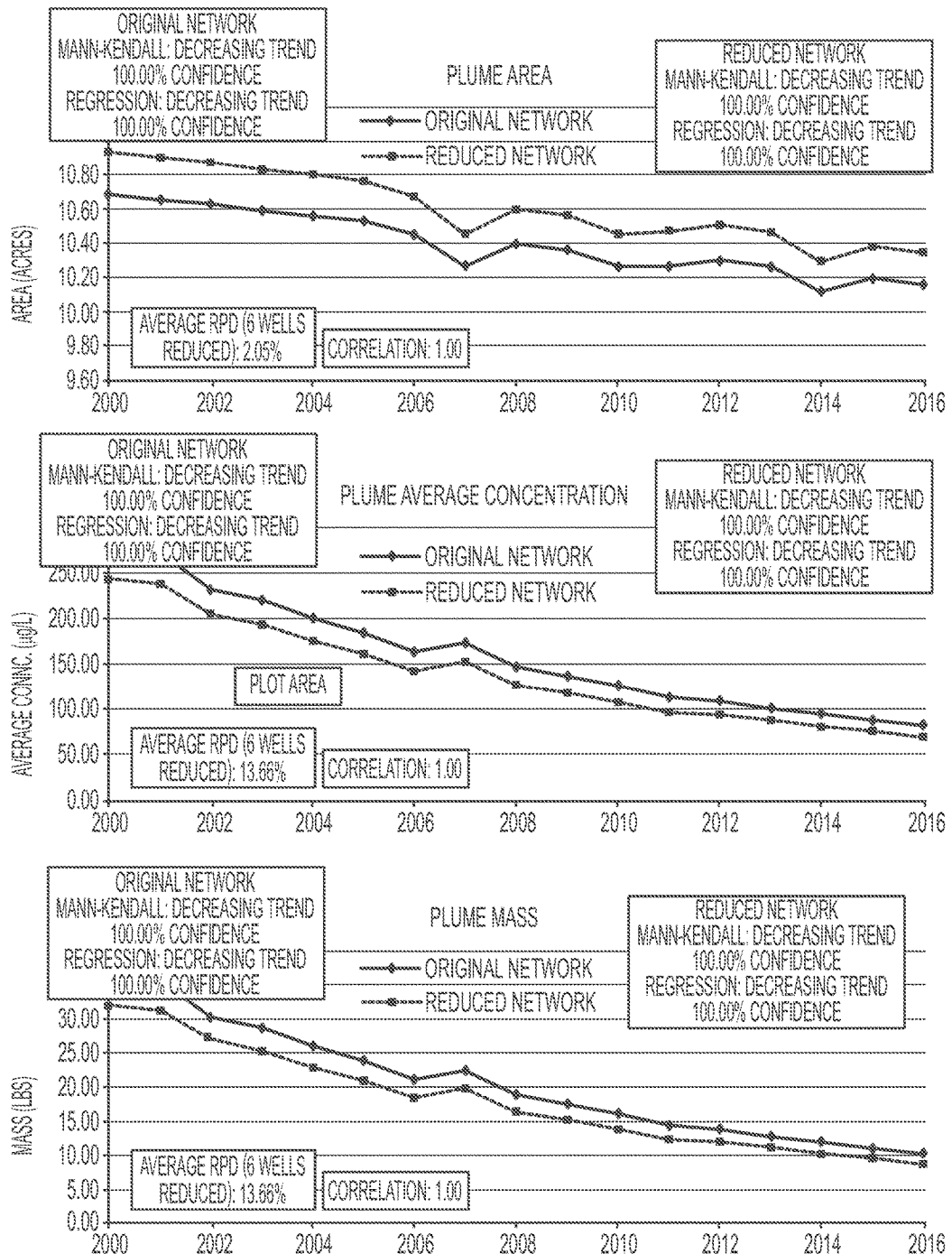

FIGS. 15 and 16 show a second well sufficiency analysis performed for a second set of hypothetical network of monitoring wells, in which 6 wells are removed from the analysis (namely "MW-23", "MW-2", "MW-5", "MW-12", "MW-26", and "MW-4"). Here, wells "MW-4" is additionally removed from the previous sufficient analysis discussed in relation to FIGS. 9-14. The resulting sufficient analysis of the second set of hypothetical network of monitoring wells shown in relation to FIG. 15 is provided in FIG. 18. According to Table 1, there is now a "Strong" argument that the removal of the 6 monitoring wells (in particular, well "MW-4") does not materially affect the sufficiency and observability of the plume measurement because the Mann-Kendall and regression parameters are the same, and the correlation parameter are greater than 0.9. Here in this second analysis, because it is now shown that the average relative-percent difference of the comparison between the baseline average concentration trendline and hypothetical average concentration trendline is now less than 20% (rather than less than 10%), and the average relative-percent difference of the comparison between the baseline mass trendline and hypothetical mass trendline is less than 20% (rather than less than 10%), the argument is downgraded from "Very Strong" to "Strong". The strength of the argument corresponds to the strength of the data collected from the optimized well network output. The strength of the data indicates relative strength of the optimized network to maintain the integrity of the plume stability evaluation going forward with the reduced well network. A "Very Strong" or "Strong" argument indicates that optimized network should be more than sufficient to maintain the integrity of the plume stability analysis. "Marginal" or "Poor" arguments will unlikely provide adequate data to maintain the integrity of the plume stability analysis going forward.

To this end, the above described method and tool facilitates a sufficiency analysis that is based on scientific and statistical methodologies that are easy-to-understand in graphical outputs. The Ricker Method Well Sufficiency Analysis, and derivative thereof, described herein, now provides the industry with a powerful new tool that will allow for scientifically-based reasoning with easy to understand graphics for reducing the number of wells and/or the frequency of well sampling and/or the number of constituents being analyzed in a monitoring well network and comparing the outcomes to a Ricker Method® plume stability analysis. The analysis is no longer based on subjective professional judgement or a program similar to MAROS and help prevent from the removal of certain wells from a well network and inadvertently compromising the integrity of future interpretations of groundwater plume characteristics and plume stability.

Referring back to FIG. 7, in some embodiments, the GUI 800 includes one or more widgets (e.g., 814) to designate a given analysis set as a baseline test. To this end, subsequent analysis may be automatically shown in view of this baseline test. For example, upon selection of the widget 814, the GUI 800 is configured to designate all wells corresponding to data objects 804 in the first pane 802 to be a part of the baseline plume analysis.

Referring still to FIG. 7, in some embodiments, the GUI 800 includes a first sampling widget 816 to select a sampling frequency for the dataset associated with the baseline analysis and a second sampling widget 818 to select a sampling frequency for the modified dataset associated with the hypothetical analysis. In some embodiments, the sampling widgets 816, 818 may provide data in "quarterly", "semi-annual", "annual", "bi-annual", etc., intervals. In some embodiments, the sampling widgets 816,818 provide a selection for the input of a user-defined interval. Interpolation techniques may be used for selection of data not-explicitly defined within the dataset.

Figure 17:
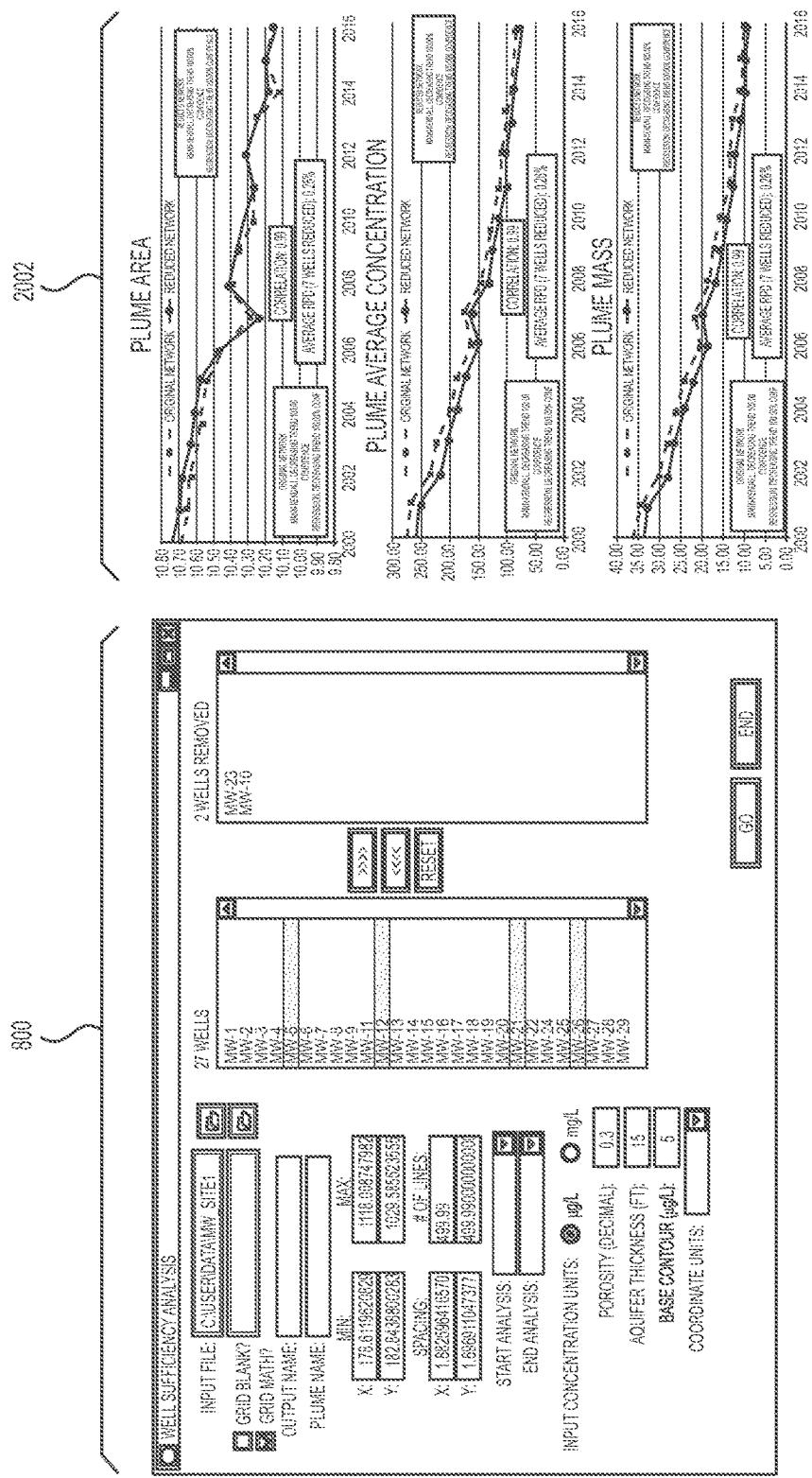
FIGS. 17, 18, and 19 are diagrams of example graphical user interfaces configured with co-display graphical outputs, in accordance with an embodiment.
Figure 18:
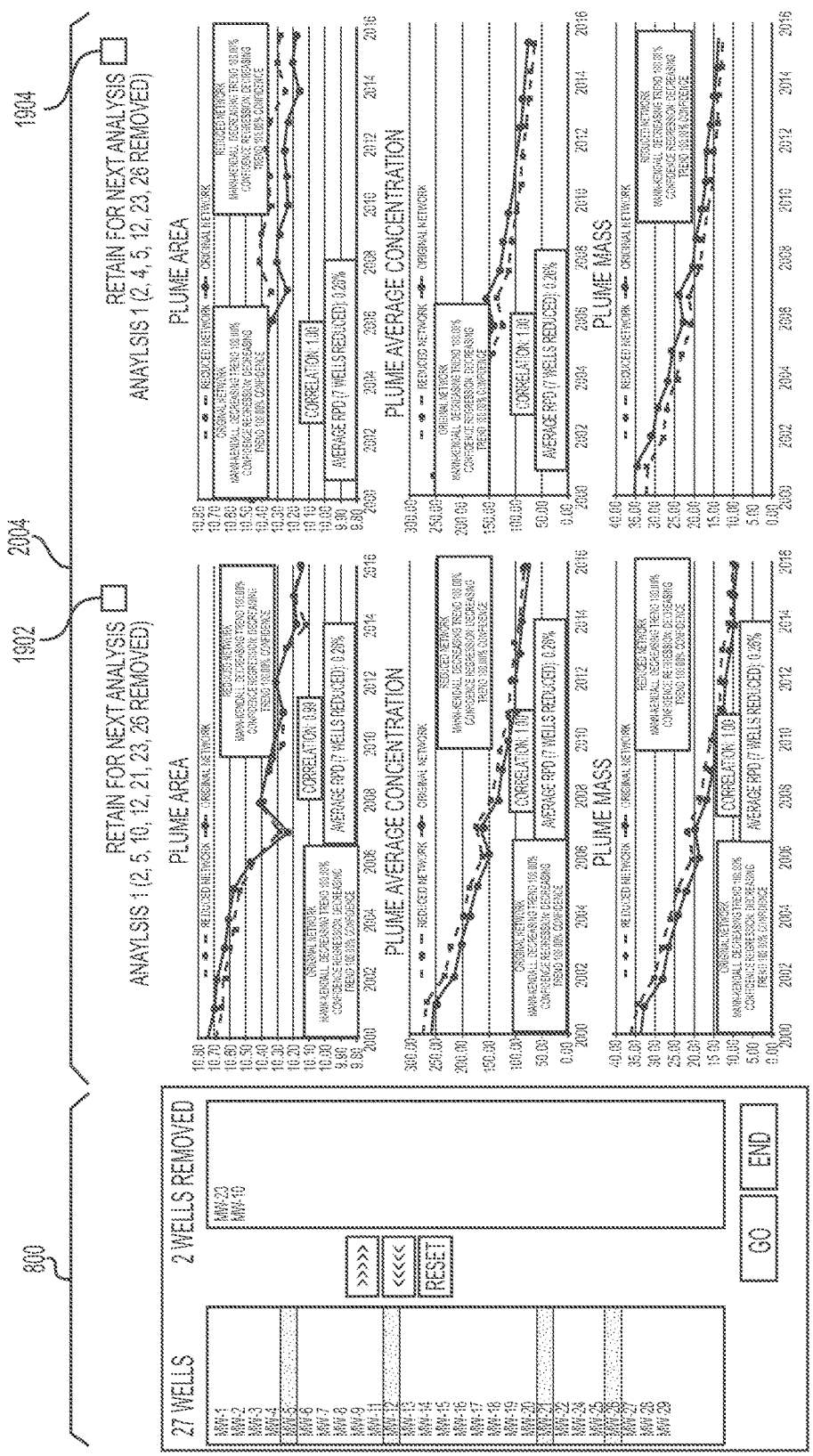
Figure 19:
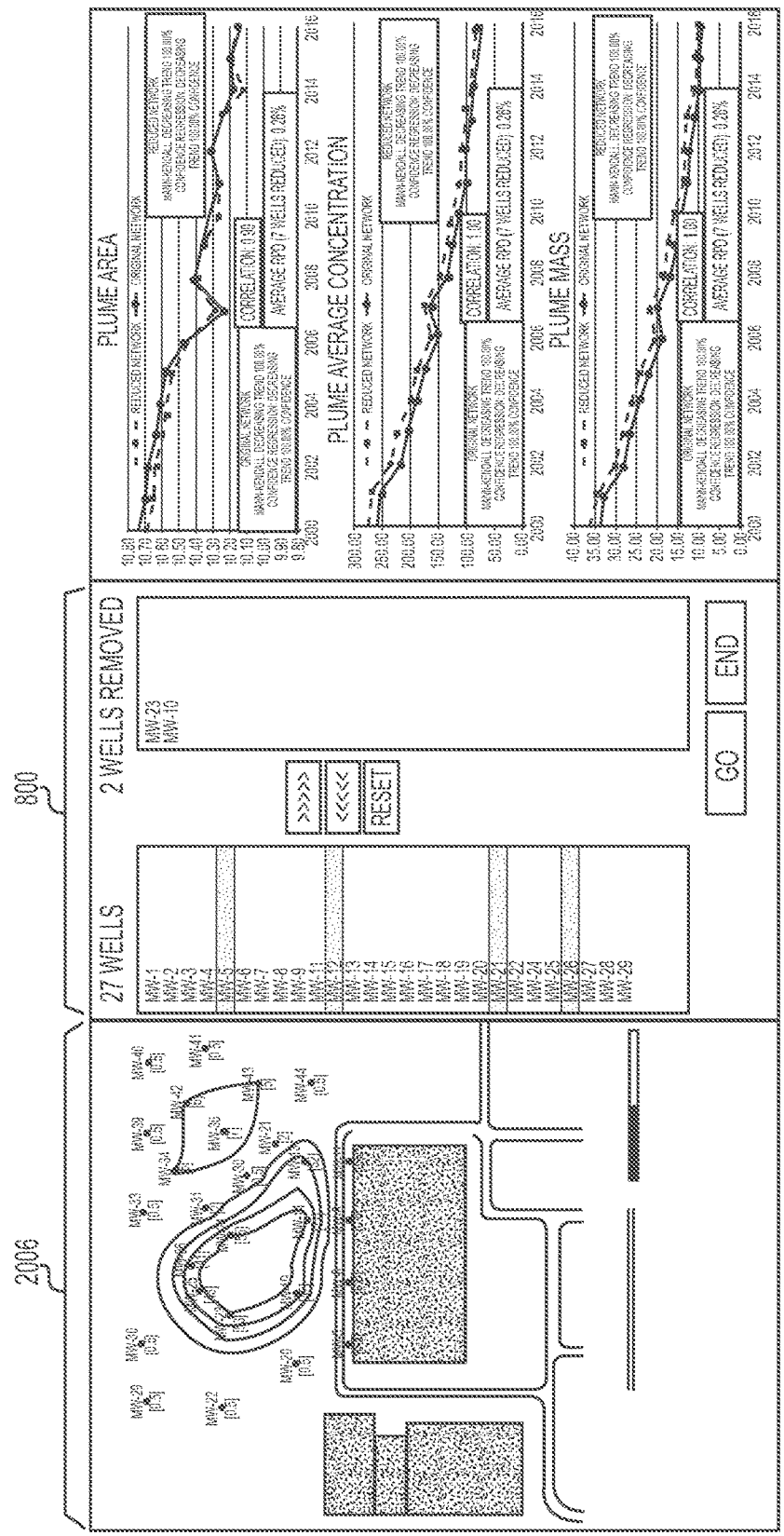

FIGS. 17, 18, and 19 are diagrams of example graphical user interfaces configured with co-display graphical outputs, in accordance with an embodiment.

In FIG. 17, the graphical user interface 800 is co-displayed, in a single user interface, along with a graphical output 2002 of the well sufficiency analysis.

In FIG. 18, the graphical user interface 800 is co-displayed, in a single user interface, with multiple graphical outputs 2004 that presents results of multiple well sufficiency analyses. In some embodiments, the interface includes a widget (e.g., 1902, 1904) to select a graphical output of one of the multiple graphical outputs 2002 and to retain the selected graphical output for a subsequent comparison of the sufficiency analysis.

In FIG. 19, the graphical user interface 800 is co-displayed, in a single user interface, along with a map widget 2006. The map widget 2006, in some embodiments, includes map data associated with a given site and well location data associated with a network of monitoring wells established at the site. In some embodiments, the map widget 2006 displays, as part of the widget, or via additional overlay widgets, markers (e.g., those shown as triangles markers) associated with each of the monitoring wells. The well widgets may be selected, in some embodiments, from the map widget 2006 to remove a given well from the well sufficiency analysis. In some embodiment, the map widget 2006 is configured to indicate de-selection of a given well upon selection made in pane 804.

In addition, it is noted that the exemplified methods and systems may be used on various measures and analysis of data acquired from data points over time. For example, the inventors can apply this analysis on temperature data, noise/sound data, and any other type of measurable data acquired over time.

In some embodiments, the tool is configured to execute a user-defined list of modifications and to store and/or generate the comparative results described herein in a report or a file (e.g., for subsequent analysis by an operator).

In another aspect, the Well Sufficiency Analysis Tool is configured to execute statistical simulation models such as a Monte Carlo simulation or similar computational algorithms to facilitate generation of wholly numerical outcomes. In some embodiments, machine learning algorithms may be performed to generate the wholly numerical outcomes. Such simulations or data processing techniques may be performed in lieu of human selection of the modification of the monitoring condition (e.g., by adding or removing wells from the monitoring well network; adjusting frequency; or adding or removing analytes of interest) by evaluating a set of possible combination and providing the optimized network solution that meets the objectives of the user. To this end, the Well Sufficiency Analysis Tool may be configured to provide a complete, or partial, automation of the process. In some embodiments, the tool is configured to evaluate all set of potential combinations as defined by a user. In other embodiments, the tool is configured to evaluate all set of potential combinations as can be performed based on the available data files of an existing network of monitoring wells.

Example Computing Device

FIG. 20 illustrates an exemplary computer that can be used for executing the well sufficiency analysis tool (e.g., the Ricker Method for Well Sufficiency Analysis Tool) described herein. In various aspects, the computer of FIG. 20 may comprise all or a portion of the development workspace 100, as described herein. As used herein, "computer" may include a plurality of computers. The computer may be a standalone system (e.g., a desktop, laptop, or server) or maybe a computing device located in a network (e.g., a cloud based system).

The computers may include one or more hardware components such as, for example, a processor 2121, a random access memory (RAM) module 2122, a read-only memory (ROM) module 2123, a storage 2124, a database 2125, one or more input/output (I/O) devices 2126, and an interface 2127. Alternatively and/or additionally, the computer may include one or more software components such as, for example, a computer-readable medium including computer executable instructions for performing a method associated with the exemplary embodiments. It is contemplated that one or more of the hardware components listed above may be implemented using software. For example, storage 2124 may include a software partition associated with one or more other hardware components. It is understood that the components listed above are exemplary only and not intended to be limiting.

Processor 2121 may include one or more processors, each configured to execute instructions and process data to perform one or more functions associated with a computer for indexing images. Processor 2121 may be communicatively coupled to RAM 2122, ROM 2123, storage 2124, database 2125, I/O devices 2126, and interface 2127. Processor 2121 may be configured to execute sequences of computer program instructions to perform various processes. The computer program instructions may be loaded into RAM 2122 for execution by processor 2121. As used herein, processor refers to a physical hardware device that executes encoded instructions for performing functions on inputs and creating outputs.

RAM 2122 and ROM 2123 may each include one or more devices for storing information associated with operation of processor 2121. For example, ROM 2123 may include a memory device configured to access and store information associated with controller 2120, including information for identifying, initializing, and monitoring the operation of one or more components and subsystems. RAM 2122 may include a memory device for storing data associated with one or more operations of processor 2121. For example, ROM 2123 may load instructions into RAM 2122 for execution by processor 2121.

Storage 2124 may include any type of mass storage device configured to store information that processor 2121 may need to perform processes consistent with the disclosed embodiments. For example, storage 2124 may include one or more magnetic and/or optical disk devices, such as hard drives, CD-ROMs, DVD-ROMs, or any other type of mass media device.

Database 2125 may include one or more software and/or hardware components that cooperate to store, organize, sort, filter, and/or arrange data used by controller 2120 and/or processor 2121. For example, database 2125 may store hardware and/or software configuration data associated with input-output hardware devices and controllers, as described herein. It is contemplated that database 2125 may store additional and/or different information than that listed above.

I/O devices 2126 may include one or more components configured to communicate information with a user associated with the computer. For example, I/O devices may include a console with an integrated keyboard and mouse to allow a user to maintain a database of images, update associations, and access digital content. I/O devices 2126 may also include a display including a graphical user interface (GUI) for outputting information on a monitor. I/O devices 2126 may also include peripheral devices such as, for example, a printer for printing information associated with controller 2120, a user-accessible disk drive (e.g., a USB port, a floppy, CD-ROM, or DVD-ROM drive, etc.) to allow a user to input data stored on a portable media device, a microphone, a speaker system, or any other suitable type of interface device.

Interface 2127 may include one or more components configured to transmit and receive data via a communication network, such as the Internet, a local area network, a workstation peer-to-peer network, a direct link network, a wireless network, or any other suitable communication platform. For example, interface 2127 may include one or more modulators, demodulators, multiplexers, demultiplexers, network communication devices, wireless devices, antennas, modems, and any other type of device configured to enable data communication via a communication network.

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

Throughout this application, various publications are referenced. The disclosures of these publications in their entireties are hereby incorporated by reference into this application in order to more fully describe the state of the art to which the methods and systems pertain.

It will be apparent to those skilled in the art that various modifications and variations.

What is claimed is:

1. A system of operating a well-sufficiency analysis tool, the system comprising:
    a processor; and
    a memory having instructions stored thereon, wherein execution of the instructions, cause the processor to:
        obtain a monitoring well data set, wherein the monitoring well data set has been repeatedly acquired over a period of time at a set of monitoring wells located at a plume site;
        present, via a graphical user interface, at a first panel of the graphical user interface, a plurality of selectable graphical objects each associated with a monitoring well;
        perform, from data of the monitoring well data set associated with a first selected group of monitoring wells, a first set of plume analyses to determine i) a first set of areal extent values over a time period associated with the repeated acquisition, or a portion thereof, ii) a first set of average concentration values over the time period or a portion thereof, iii) a first set of mass indicator values over the time period or a portion thereof;
        determine a first areal extent trend line as a trendline of the first set of areal extent values;
        determine a first average concentration trend line as a trendline of the first set of average concentration values;
        determine a first mass indicator trend line as a trendline of the first set of mass indicator values;
        receive, via the graphical user interface, at the first panel, a second selection of a second selected group of monitoring wells, wherein the second selected group of monitoring wells comprises a second number of monitoring wells, and wherein the first number of monitoring wells is greater than the second number of monitoring wells;
        perform, from data of the monitoring well data set associated with the second selected group of monitoring wells, a second set of plume analyses to determine i) a second set of areal extent values over the time period or a portion thereof, ii) a second set of average concentration values over the time period or a portion thereof, iii) a second set of mass indicator values over the time period or a portion thereof
        determine a second areal extent trend line as a trendline of the second set of areal extent values;
        determine a second average concentration trend line as a trendline of the second set of the average concentration values;
        determine a second mass indicator trend line as a trendline of the second set of mass indicator values;
        determine a first sufficiency parameter between the first areal trend line and the second areal trend line, wherein the first sufficiency parameter includes a parameter, or a combination of parameters, selected from the group consisting of a linear regression parameter, a Mann-Kendall parameter, a correlation parameter, and a relative percent difference parameter;
        determine a second sufficiency parameter between the first average concentration trend line and the second average concentration trend line, wherein second sufficiency parameter includes a parameter, or a combination of parameters, selected from the group consisting of the linear regression parameter, the Mann-Kendall parameter, the correlation parameter, and the relative percent difference parameter;
        determine a third sufficiency parameter between the first mass indicator trend line and the second mass indicator trend line, wherein the third sufficiency parameter is a parameter, or a combination of parameters, selected from the group consisting of the linear regression parameter, the Mann-Kendall parameter, the correlation parameter, and the relative percent difference parameter; and
        present, via the graphical user interface, a well sufficiency analysis of the second selected group of monitoring wells in reference to the first selected group of monitoring wells, wherein the presented well sufficiency analysis indicates, to a user viewing the graphical user interface, i) a first visual representation of the first and second areal trend lines, ii) a second visual representation of the first and second average concentration trend lines, iii) a third visual representation of the first and second mass indicator trend lines, and iv) a fourth visual representation of a numeral or symbol associated with the first sufficiency parameter, a numeral or symbol associated with the second sufficiency parameter, and a numeral or symbol associated with the third sufficiency parameter,
        wherein the one or more visual representations of the numeral or symbol associated with the first, second, and third sufficiency parameters are used in conjunction with a guideline that maps the numeral or symbol associated with the first, second, and third sufficiency parameters to an assessment of sufficiency of monitoring, and wherein the assessment of sufficiency of monitoring is used to reduce the set of monitoring wells to the second set of monitoring wells in future monitoring of the set of monitoring wells at a plume site.

2. The system of claim 1, wherein the instructions, when executed, further cause the processor to:
receive, via the graphical user interface, at the first panel, a third selection of a third selected group of monitoring wells, wherein the third selected group of monitoring wells comprises a third number of monitoring wells, and wherein the first number of monitoring wells is greater than the third number of monitoring wells;
perform, from data of the monitoring well data set, said data associated with the third selected group of monitoring wells of the plume site, a third set of plume analyses to determine i) a third set of areal extent values at the plurality of time intervals, ii) a third set of average concentration values at the plurality of time intervals, iii) a third set of mass indicator values at the plurality of time intervals, and iv) a third set of location values associated with a center of mass of the plume site at the plurality of time intervals;
determine a third areal extent trend line as a trendline of the third set of the areal extent values across the plurality of time intervals;
determine a third average concentration trend line as a trendline of the third set of the average concentration values across the plurality of time intervals;
determine a third mass indicator trend line as a trendline of the third set of the mass indicator values across the plurality of time intervals;
determine a fourth sufficiency parameter between the first areal trend line and the third areal trend line, wherein the fourth sufficiency parameter includes a parameter, or a combination of parameters, selected from the group consisting of a linear regression parameter, a Mann-Kendall parameter, a correlation parameter, and a relative percent difference parameter;
determine a fifth sufficiency parameter between the first average concentration trend line and the third average concentration trend line, wherein fifth sufficiency parameter includes a parameter, or a combination of parameters, selected from the group consisting of the linear regression parameter, the Mann-Kendall parameter, the correlation parameter, and the relative percent difference parameter;
determine a sixth sufficiency parameter between the first mass indicator trend line and the third mass indicator trend line, wherein the sixth sufficiency parameter is a parameter, or a combination of parameters, selected from the group consisting of the linear regression parameter, the Mann-Kendall parameter, the correlation parameter, and the relative percent difference parameter;
present, via the graphical user interface, a second well sufficiency analysis of the third selected group of monitoring wells in reference to the first selected group of monitoring wells and/or the second selected group of monitoring wells, wherein the presented second well sufficiency analysis imprints, to the user viewing the graphical user interface, i) a modified first visual representation of the first and third areal extent trend line, ii) a modified second visual representation of the first and third average concentration trend line, iii) a modified third visual representation of the first and third mass indicator trend line, and iv) a modified fourth visual representations of a numeral or symbol associated with the fourth sufficiency parameter, a numeral or symbol associated with the fifth sufficiency parameter, and a numeral or symbol associated with sixth third sufficiency parameter.

3. The system of claim 1, wherein each of the first sufficiency parameter, the second sufficiency parameter, and the third sufficiency parameter includes the linear regression parameter, the Mann-Kendall parameter, the correlation parameter, and
the relative percent difference parameter.

4. The system of claim 3, wherein the instructions, when executed by the processor, cause the processor to:
generate a report of the well sufficiency analysis of the second selected group of monitoring wells in reference to the first selected group of monitoring wells, wherein the report imprints, to a user viewing the report i) the first visual representation of the first and second areal trend lines, ii) the second visual representation of the first and second average concentration trend lines, iii) the third visual representation of the first and second mass indicator trend lines, and iv) the fourth visual representation of the numeral or symbol associated with the first sufficiency parameter, the numeral or symbol associated with the second sufficiency parameter, and the numeral or symbol associated with the third sufficiency parameter;
wherein the report is used in conjunction with, or includes, the guideline to assess sufficiency of monitoring of the plume site based on the set of monitoring wells corresponding to the second selected group of monitoring wells for the purpose of modifying, wholly, or partially, future repeated acquisition from the current set of monitoring wells to the second selected group of monitoring wells.

5. The system of claim 1, wherein the instructions, when executed by the processor, cause the processor to:
prompt, via the graphical user interface, an analysis start time parameter and an analysis end time parameter, wherein a first value associated with the analysis start time parameter and a second value associated with the analysis end time parameter define a time span of the plurality of time intervals used for the well sufficiency analysis.

6. The system of claim 1, wherein each of the first, second, third, and fourth visual representations is presented in a second panel of the graphical user interface.

7. The system of claim 1, wherein the first, second, and third visual representations are presented, respectively, in a second, third, and fourth panels, of the graphical user interface.

8. The system of claim 1, wherein the plurality of graphical objects associated with monitoring wells are presented as selectable widgets on a visual representation of a map.

9. A system comprising:
a processor; and
a memory having instructions stored thereon, wherein the instructions, when executed by the processor, cause the processor to:
obtain plume stability evaluation data for a given plume, the plume stability evaluation data being associated with a plurality of monitoring wells, wherein each evaluation data includes plume areal values over time, plume average concentration values over time, and plume mass values over time;
determine a first set of trend lines using a first set of the plume stability evaluation data associated with a first set of monitoring wells, wherein the first set of monitoring wells comprises a first number of monitoring wells, wherein the first set of trend lines includes a first areal trend line, a first average concentration trend line, and a first mass indicator trend line, wherein the first areal trendline is determined as a trendline of the plume areal values over time, wherein the first average concentration trend line is determined as a trendline of the plume average concentration values over time, and wherein the first mass indicator trend line is determined as a trendline of the plume mass values over time;

obtain a second set of plume stability evaluation data for the given plume, the second set of plume stability evaluation data being associated with a second set of monitoring wells, wherein the second set of monitoring wells comprises a second number of monitoring wells different from the first number of monitoring wells, wherein the first set of monitoring wells includes one or more wells not included in the second set of monitoring wells, and wherein each evaluation data includes a second set of plume areal extent values over time, a second set of plume average concentration values over time, and a second set of plume mass values over time;

determine a second set of trend lines using a second set of the plume stability evaluation data associated with a second set of monitoring wells, wherein the second set of monitoring wells comprises a second number of monitoring wells, wherein the second set of trend lines including a second areal trend line, a second average concentration trend line, and a second mass indicator trend line;

determine a set of sufficiency parameters between the first areal trend line and the second areal trend line, between the first average concentration trend line and the second average concentration trend line, and between the first mass indicator trend line and the second mass indicator trend line, wherein the set of sufficiency parameters includes a parameter, or a combination of parameters, selected from the group consisting of a linear regression parameter, a Mann-Kendall parameter, a correlation parameter, and a relative percent difference parameter; and cause i) via a display, presentation of a plurality of graphical outputs of the first set of trend lines, the second set of trend lines, and the set of sufficiency parameters and/or ii) generation of a report with the plurality of graphical outputs or data associated with the plurality of graphical outputs, wherein the graphical outputs via the display or the report are used in conjunction with a guideline that maps a numeral or symbol associated with set of sufficiency parameters to an assessment of sufficiency of monitoring, and wherein the assessment of sufficiency of monitoring are used to reduce the set of monitoring wells to the second set of monitoring wells in future monitoring of the set of monitoring wells at the given plume, to modify sampling frequency of the future monitoring of the set of monitoring wells at the given plume, or a combination thereof.

10. The system of claim 9, wherein the plurality of presentations comprise:
(i) a first graphical presentation of the first areal trend line and the second areal trend line,
(ii) a second graphical presentation of first average concentration trend line and the second average concentration trend line, and
(iii) a third graphical presentation of the first mass indicator trend line and the second mass indicator trend line.

11. The system of claim 10, wherein the plurality of presentations further comprise:
(iv) a fourth graphical presentation of a Mann-Kendall parameter associated with each of the first, second, and third graphical presentations,
(v) a fifth graphical presentation of a correlation parameter associated with each of the first, second, and third graphical presentations,
(vi) a sixth graphical presentation of a relative-percent difference parameter associated with each of the first, second, and third graphical presentations, and
(vii) a seventh graphical presentation of a linear regression parameter associated with each of the first, second, and third graphical presentations.

12. The system of claim 9, wherein the guideline indicates a strong sufficiency classification for removal or reduced sampling when i) each of the Mann-Kendall parameters among the first, second, and third presentations are the same, ii) each of the linear regression parameter among the first, second third presentations are the same, iii) at least one of the relative percent difference among the first, second third presentations are less than 20 percent, and iv) each of the correlation coefficient among the first, second third presentations is greater than 0.8.

13. The system of claim 9, wherein the guideline indicates a very strong sufficiency classification for removal or reduced sampling when i) each of the Mann-Kendall parameters among the first, second, and third presentations are the same, ii) each of the linear regression parameter among the first, second third presentations are the same, iii) at least one of the relative percent difference among the first, second third presentations are less than 10 percent, and iv) each of the correlation coefficient among the first, second third presentations is greater than 0.9.

14. The system of claim 9, wherein the guideline indicates a poor sufficiency classification for removal or reduced sampling when i) at least one of the relative percent difference among the first, second third presentations are greater than 30 percent, and ii) each of the correlation coefficient among the first, second third presentations is less than 0.7.

15. A non-transitory computer readable medium having instructions stored thereon, wherein the instructions when executed by a processor, cause the processor to:

present, via a graphical user interface, at a first panel, a plurality of graphical objects each associated with a monitoring well, wherein each of the monitoring wells are used, in a plume analysis, to determine a first areal trend line, a first average concentration trend line, and a first mass indicator trend line, associated with a given plume site for a first group of monitoring wells associated with a plume, wherein the first group of monitoring wells comprises a first number of monitoring wells;

upon receipt, via the graphical user interface, at the first panel, selection of one or more graphical objects to remove the one or more associated monitoring wells from a subsequent plume analysis:

determine, in the subsequent plume analysis, a second areal trend line, a second average concentration trend line, and a second mass indicator trend line, associated with the given plume site for a second group of monitoring wells, wherein the second group of monitoring wells comprises a second number of monitoring wells, and wherein the second number of monitoring wells is less than the first number of monitoring wells;

determine a set of sufficiency parameters between the first areal trend line and the second areal trend line, between the first average concentration trend line and the second average concentration trend line, and between the first mass indicator trend line and the second mass indicator trend line, wherein the set of sufficiency parameters includes a parameter, or a combination of parameters, selected from the group consisting of a linear regression parameter, a Mann-Kendall parameter, a correlation parameter, and a relative percent difference parameter; and present, via the graphical user interface, a first visual representation of the first and second areal trend line, a second visual representation of the first and second average concentration trend line, a third visual representation of the first and second mass indicator trend line, and one or more visual representations for the set of sufficiency parameters associated with each of the first, second, and third visual representations, wherein the one or more visual representations for the set of sufficiency parameters are used to assess sufficiency of monitoring, and wherein the assessment of sufficiency of monitoring is used to reduce the set of monitoring wells to the second set of monitoring wells in future monitoring of the set of monitoring wells at a plume site.

16. The computer readable medium of claim 15, wherein the instructions, when executed, further cause the processor to:

upon receipt, via the graphical user interface, at the first panel, second selection of one or more graphical objects to add one or more associated monitoring wells to a second subsequent plume analysis:

determine, in the second subsequent plume analysis, a third areal trend line, a third average concentration trend line, and a third mass indicator trend line, associated with the given plume site for a third group of monitoring wells, wherein the third group of monitoring wells comprises a third number of monitoring wells, and wherein the third number of monitoring wells is greater than the second number of monitoring wells;

determine a second set of sufficiency parameters between the first areal trend line and the third areal trend line, between the first average concentration trend line and the third average concentration trend line, and between the first mass indicator trend line and the third mass indicator trend line, wherein the second set of sufficiency parameters includes a parameter, or a combination of parameters, selected from the group consisting of a linear regression parameter, a Mann-Kendall parameter, a correlation parameter, and a relative percent difference parameter; and present, via the graphical user interface, a modified first visual representation of the first and third areal trend line, a modified second visual representation of the first and third average concentration trend line, and a modified third visual representation of the first and second mass indicator trend line, and one or more modified visual representations for the second set of sufficiency parameters associated with each of the modified first, second, and third visual representations;

wherein the one or more modified visual representations for the second set of sufficiency parameters are used to assess sufficiency of monitoring, and wherein the assessment of sufficiency of monitoring are used to modify sampling frequency of future monitoring of the set of monitoring wells at a plume site.

17. The computer readable medium of claim 15, wherein the one or more visual representations associated with the one or more statistical parameters comprise:

a fourth visual representation of the Mann-Kendall parameter;

a fifth visual representation of the correlation parameter;

a sixth visual representation of the relative percent difference parameter; and a seventh visual representation of the linear regression parameter.

18. The computer readable medium of claim 17, wherein each of the first, second, third, fourth, fifth, and sixth visual representations is presented in a second panel of the graphical user interface.

19. The computer readable medium of claim 15, wherein the first, second, and third visual representations are presented in a second, third, and fourth panels, respectively, of the graphical user interface.

20. A method to determine sufficiency of analysis of monitoring wells data for a given site, the method comprising:

determining a first plume area profile, a first plume average concentration profile, and a first plume mass profile associated with a first set of grid data generated from a first set of wells test data associated with a network of monitoring wells used to monitor plume contamination at a site;

determining a second plume area profile, a second plume average concentration profile, and a second plume mass profile from a second set of grid data generated from a second set of wells test data associated with the network of monitoring wells, wherein the second set of wells test data includes a sampling configuration selected from the group consisting of: i) one or more less monitoring wells from the network of monitoring wells, ii) a lower sampling frequency of the monitoring; and iii) a fewer number or different tested analytes sampled from the network of monitoring wells;

generating a plurality of sufficiency parameters for assessing sufficiency of the second set of wells test data, wherein the plurality of sufficiency parameters includes one or more one or more sufficiency parameters for each of i) a first comparison of the first plume area profile with the second plume area profile, ii) a second comparison of the first average concentration profile and the second average concentration profile, and iii) a third comparison of the first mass profile and the second mass profile, wherein each of the one or more sufficiency parameters are selected from the group consisting one or more Mann-Kendall parameters, one or more linear regression parameters, one or more correlation parameters, and one or more relative-percent difference parameters; and presenting or storing the generated one or more sufficiency parameters to assess sufficiency of monitoring, wherein the assessment of sufficiency of monitoring is used to reduce the set of monitoring wells to the second set of monitoring wells in future monitoring of the set of monitoring wells at a plume site.

21. The method of claim 20, wherein the one or more sufficiency parameters consist of one or more Mann-Kendall parameters, one or more linear regression parameters, one or more correlation parameters, and one or more relative-percent difference parameters.

\* \* \* \* \*